(12) United States Patent
Morris, III

(10) Patent No.: US 7,446,628 B2
(45) Date of Patent: Nov. 4, 2008

(54) POLE-ZERO ELEMENTS AND RELATED SYSTEMS AND METHODS

(75) Inventor: Arthur S. Morris, III, Raleigh, NC (US)

(73) Assignee: Wispry, Inc., Irvine, CA (US)

( * ) Notice: Subject to any disclaimer, the term of this patent is extended or adjusted under 35 U.S.C. 154(b) by 350 days.

(21) Appl. No.: 11/298,295

(22) Filed: Dec. 9, 2005

(65) Prior Publication Data

US 2006/0202778 A1 Sep. 14, 2006

Related U.S. Application Data

(60) Provisional application No. 60/634,644, filed on Dec. 9, 2004.

(51) Int. Cl.
*H01P 5/12* (2006.01)
*H03H 7/46* (2006.01)

(52) U.S. Cl. .................. 333/132; 333/126; 333/129

(58) Field of Classification Search ............... 333/132, 333/126, 129, 134

See application file for complete search history.

(56) References Cited

U.S. PATENT DOCUMENTS

| | | | |
|---|---|---|---|
| 4,385,402 A | | 5/1983 | Barrs |
| 4,436,956 A | | 3/1984 | Schreiber |
| 4,581,588 A | | 4/1986 | Schreiber |
| 4,724,407 A | | 2/1988 | Miura et al. |
| 4,733,203 A | | 3/1988 | Ayasli |
| 5,054,117 A | | 10/1991 | Cruz et al. |
| 5,227,747 A | * | 7/1993 | Komazaki et al. ............ 333/206 |
| 5,227,748 A | * | 7/1993 | Sroka ......................... 333/207 |
| 5,512,866 A | * | 4/1996 | Vangala et al. ............... 333/134 |
| 5,815,048 A | | 9/1998 | Ala-Kojola et al. |
| 5,959,516 A | * | 9/1999 | Chang et al. ................. 334/14 |
| 6,064,866 A | | 5/2000 | Lange |
| 6,307,448 B1 | | 10/2001 | Atokawa et al. |
| 6,332,071 B1 | * | 12/2001 | Brandt ......................... 455/82 |
| 6,414,566 B1 | | 7/2002 | Atokawa |
| 6,472,957 B1 | | 10/2002 | Dobrovolny |
| 6,522,220 B2 | | 2/2003 | Yamada et al. |
| 6,525,624 B1 | | 2/2003 | Hikita et al. |
| 6,549,097 B2 | * | 4/2003 | Guillon et al. .............. 333/174 |
| 6,876,482 B2 | | 4/2005 | DeReus |
| 6,950,410 B1 | * | 9/2005 | Brandt ......................... 370/276 |
| 7,274,278 B2 | * | 9/2007 | Weller et al. ................ 333/262 |
| 2004/0036132 A1 | | 2/2004 | de los Santos |

OTHER PUBLICATIONS

International Search Report dated Feb. 12, 2008 for PCT Application No. PCT/US05/44678.

* cited by examiner

*Primary Examiner*—Robert J. Pascal
*Assistant Examiner*—Kimberly E Glenn
(74) *Attorney, Agent, or Firm*—Jenkins, Wilson, Taylor & Hunt, P.A.

(57) ABSTRACT

According to one aspect, the subject matter described herein includes a tunable duplexer. The tunable duplexer can include a common node for communicating signals comprising a plurality of frequencies. Further, the tunable duplexer can include first and second band nodes for communicating first and second predetermined frequency bands, respectively, of the plurality of frequencies. The tunable duplexer can also include a filter coupled between the common node and the first and second band nodes. The filter can include pole-zero elements adapted to pass signals of the first and second predetermined frequency bands to the first and second band nodes, respectively. Further, the filter can be adapted to block signals of the first and second predetermined frequency band to the second and first band nodes, respectively.

18 Claims, 28 Drawing Sheets

POLE-ZERO ELEMENTS AND RELATED SYSTEMS AND METHODS

RELATED APPLICATIONS

This application claims the benefit of U.S. Provisional Patent Application Ser. No. 60/634,644, filed Dec. 9, 2004; the disclosure of which is incorporated herein by reference in its entirety.

Additionally, co-pending U.S. patent application Ser. No. 11/298,307, filed simultaneously herewith, entitled "Micro-Electro-Mechanical System (MEMS) Capacitors, Inductors, And Related Systems and Methods", is incorporated herein by reference in its entirety.

TECHNICAL FIELD

The present subject matter relates generally to electrical circuitry. More particularly, the present subject matter relates to pole-zero elements and related systems and methods.

BACKGROUND

Filters are commonly used in electronic applications to achieve desired performance characteristics. Exemplary filters include high-pass filters, low-pass filters, band-pass filters, and band-stop filters. Each filter type can provide a specific filtering function.

Electrical circuitry utilizing filters include tunable duplexers, phase shifters, tunable matching networks, and reconfigurable power amplifiers. There exists a continuing need for high-quality factor (Q), low insertion loss tunable filtering in these circuits. In RF and microwave applications, for example, placing a sharply defined band-pass filter at a receiver antenna input can eliminate various adverse effects resulting from strong interfering signals at frequencies near the desired signal frequency in such applications.

In communications systems, duplexers provide the ability to receive and transmit signals while using the same antenna. In a typical transmission operation, only signals of a designated transmission frequency are passed to an antenna, which transmits the signal as a radio signal into the air. In a typical receiving operation, a signal received by an antenna is transmitted to the duplexer to select only a signal of the designated frequency. A duplexer uses resonant circuits to isolate a transmitter from a receiver for allowing the transmitter and the receiver to operate on the same antenna at the same time without the transmitter adversely affecting the receiver. Duplexers use filters, such as various pass band filters and notches to accomplish isolation and continuity in signal transfer. In duplexer operation, filters must pass the desired signal while rejecting as much as possible of the undesired signals.

The increased diversity in the functionality of mobile phones has resulted in an increase in the complexity of duplexer design. For example, increased mobile phone functions such as dual mode (e.g., a combination of an analog mode and a digital mode, or a combination of digital modes, such as TDMA or CDMA), and a dual band (e.g., a combination of an 800 MHz band and a 1.9 GHz band, or a combination of a 900 MHz band and a 1.8 GHz band or a 1.5 GHz band) have been increasing the complexity of mobile phone architecture and circuitry. Increased implementation of frequency related functions affect antenna bandwidth. Antenna bandwidth is generally the range of frequencies over which the antenna can operate while some other characteristic remains in a given range. Therefore, increased frequency ranges increase demand for performance over a number of frequency channels, or a wide bandwidth antenna. Moreover, to support these multiple, diverse functions while maintaining proper isolation and reliable signal transfer between transmitter and receiver operations, present communication devices use fixed, redundant circuitry, such as an increased quantity of switches and filters to compensate and broaden duplexer capabilities. Accordingly, such increased use and quantity of filters creates the need for optimizing filter performance.

There is a continuing demand for component reduction and high performance communications devices. Elimination of redundant components, functions, or circuitry is highly desired in communication electronics. Increased performance in communication devices without increasing device size or weight is similarly desirable. Further, there is a continuing need for reliable and quality signal transfer, improved transmitter-receiver isolation, and very high Q value circuitry with respect to duplexers.

Micro-electro-mechanical system (MEMS) technology is currently implemented for various filtering circuitry. Exemplary MEMS components that have been used for filtering include MEMS capacitors. Although there have been improvements in the development of MEMS components for filtering, there is a continuing need for improved performance and stability of these components. Further, there is a demand for improvement in the precision of the capacitance value of MEMS capacitors.

Therefore, it is desirable to provide improved filtering circuitry and related filtering components. Further, there is a need for improved MEMS components for use in filtering circuitry.

SUMMARY

In accordance with this disclosure, novel pole-zero elements and related systems and methods are provided.

It is an object of the present disclosure therefore to provide novel pole-zero elements and related systems and method. This and other objects as may become apparent from the present disclosure are achieved, at least in whole or in part, by the subject matter described herein.

BRIEF DESCRIPTION OF THE DRAWINGS

Exemplary embodiments will now be explained with reference to the accompanying drawings, of which.

DETAILED DESCRIPTION

According to one aspect of the present disclosure, pole-zero elements can be employed in electrical circuitry having a filter. Exemplary electrical circuitry includes tunable duplexers, phase shifters, tunable matching networks, and reconfigurable power amplifiers. Pole-zero elements can be employed to any filter wherein high contrast is desired between a pair of frequency regions. By using a pole-zero element in accordance with the subject matter described herein, broadband transparency can be provided except near and between the zero and pole and provide local frequency control.

According to one embodiment, a pole-zero element can be a two-terminal circuit with an electrical response having 1 pole and 1 zero in impedance. In the operation of a duplexer, for example, the pole and zero frequencies may be close to one another. A pole-zero element can be used as a series component. When employed as a series component, the zero frequency of the pole-zero element can correspond to the pass frequency where minimum loss is desired, and the pole frequency can correspond to the stop frequency where maximum isolation is desired. Conversely, as a shunt component when connected at one terminal to ground, the pole frequency of the pole-zero element can correspond to the pass frequency where minimum loss is desired, and the zero frequency can correspond to the stop frequency where maximum isolation is desired.

According to embodiment of the subject matter described herein, a duplexer can include a common node that can be connected to an antenna for communicating signals of a plurality of frequencies. The duplexer can also include first and second band nodes that can be connected to a transmitter and a receiver. The transmitter and receiver can communicate signals in first and second predetermined bands, respectively, of the plurality of frequencies. The duplexer can include a variable filter coupled between the common node and the first and second band nodes for allowing the transmitter and the receiver to communicate on the antenna without one adversely affecting the other. The filter can include pole-zero elements that can pass signals of the first and second predetermined bands to the first and second band nodes, respectively. The pole-zero elements can also block signals of the first and second predetermined frequency band to the second and first band nodes, respectively.

Figure 1:
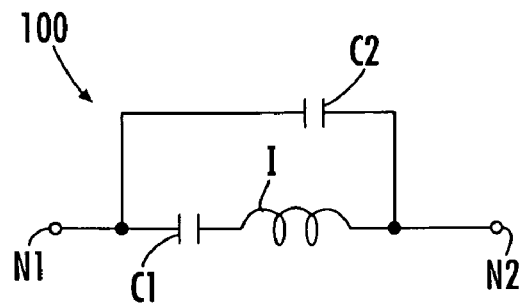
FIGS. 1-4 are schematic diagrams of exemplary pole-zero elements according to one embodiment of the subject matter described herein.

FIGS. 1-4 of the drawings are schematic diagrams and illustrate exemplary pole-zero elements according to one embodiment of the subject matter described herein. One or more of the pole-zero elements can be included in a variable filter of a tunable duplexer for achieving a desired frequency response in the duplexer. Referring to FIG. 1, a pole-zero element 100 can include an inductor I and capacitors C1 and C2. Inductor I can be connected in a series arrangement with capacitor C1. The series arrangement of inductor I and capacitor C1 can be connected in parallel with capacitor C2 at nodes N1 and N2. Pole-zero element 100 can be included in a transmission component of a duplexer for passing signals of a transmit frequency band and blocking signals of a receive frequency band. For example, pole-zero element 100 can be connected in series between transmission circuitry and an antenna for passing transmission signals to the transmission circuitry and blocking reception signals. Further, one or more pole-zero elements 100 may also be connected in a series arrangement to result in higher orders of filtering. For example, the impedance magnitude for element 100 can be much less than z0 at a transmission frequency. The impedance magnitude for element 100 can be greater than or about equal to z0 at a reception frequency.

Figure 2:
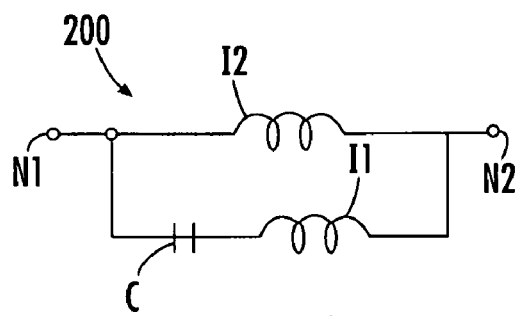

Referring to FIG. 2, a pole-zero element 200 can include a capacitor C and inductors I1 and I2. Capacitor C can be connected in a series arrangement with inductor I1. The series arrangement of capacitor C and inductor I1 can be connected in parallel with inductor I2 at nodes N1 and N2. Pole-zero element 200 can be included in a reception component of a duplexer for passing signals of a receive frequency band and blocking signals of a transmit frequency band. For example, pole-zero element 200 can be connected in series between reception circuitry and an antenna for passing reception signals to the reception circuitry and blocking transmission signals. Further, a plurality of pole-zero elements 200 may also be connected in a series arrangement to result in higher orders of filtering. For example, the impedance magnitude for element 200 can be much less than z0 at a reception frequency. The impedance magnitude for element 200 can be greater than or about equal to z0 at a transmission frequency.

Figure 3:
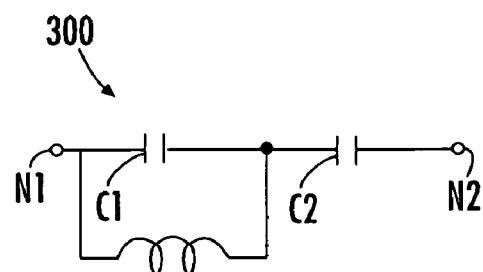

Referring to FIG. 3, a pole-zero element 300 can include an inductor I and capacitor C1 and C2. Capacitor C1 and inductor I can be connected in a parallel arrangement. The parallel arrangement of capacitor C1 and inductor I can be connected in series with capacitor C2 across nodes N1 and N2. Pole-zero element 300 can be included in a reception component of a duplexer for passing signals of a receive frequency band and blocking signals of a transmit frequency band. For example, pole-zero element 300 can be connected at node N2 to ground and at node N1 to a point in the signal path between reception circuitry and an antenna for passing reception signals to the reception circuitry and blocking transmission signals. Further, one or more pole-zero elements 300 can also be connected between the ground and the signal path between the reception circuit and the antenna for resulting in higher orders of filtering. For example, the impedance magnitude for element 300 can be much greater than z0 at the reception frequency. The impedance magnitude for element 300 can be less than or about equal to z0 at the transmission frequency.

Figure 4:
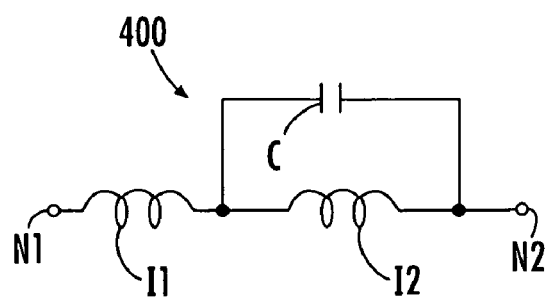

Referring to FIG. 4, a pole-zero element 400 can include a capacitor C and inductors I1 and I2. Capacitor C and inductor I2 can be connected in a parallel arrangement. The parallel arrangement of capacitor C and inductor I2 are connected in series with inductor I1 across nodes N1 and N2. Pole-zero element 400 can be included in a transmission component of a duplexer for passing signals of a transmit frequency band and blocking signals of a receive frequency band. For example, pole-zero element 400 can be connected at node N1 to ground and at node N2 to a point in the signal path between the transmission circuitry and an antenna for passing transmission signals to the transmission circuitry and blocking reception signals. Further, one or more pole-zero elements 400 can also be connected between ground and the signal path between the transmission circuit and the antenna for resulting in higher orders of filtering. For example, the impedance magnitude for element 400 can be much greater than z0 at the transmission frequency. The impedance magnitude for element 400 can be less than or about equal to z0 at the reception frequency.

Figure 5:
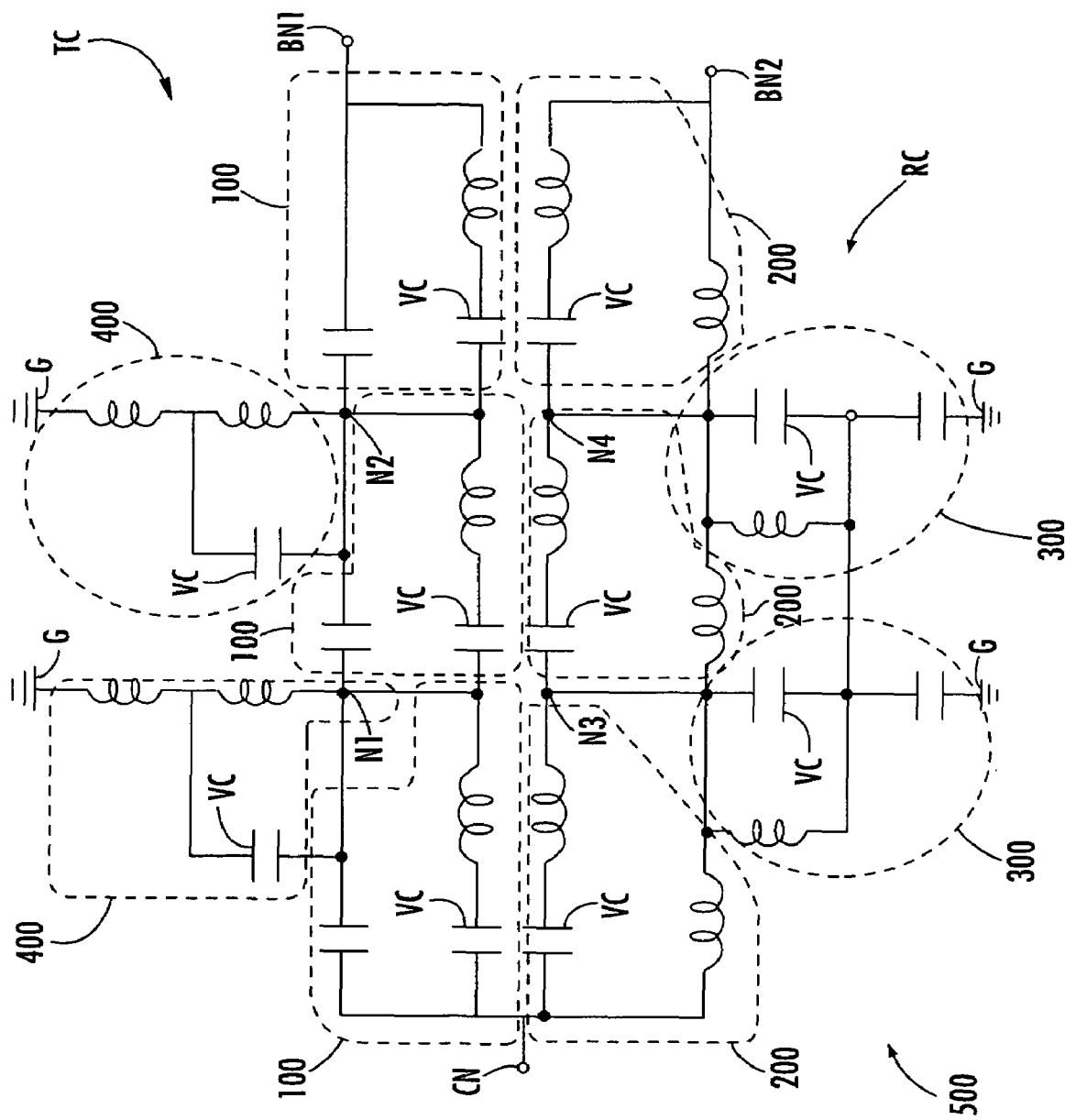
FIG. 5 is a schematic diagram of an exemplary duplexer including pole-zero elements according to one embodiment of the subject matter described herein.

The pole-zero elements described herein can be included in one or more filters of a duplexer. FIG. 5 illustrates a schematic diagram of an exemplary tunable duplexer 500 including pole-zero elements according to one embodiment of the subject matter described herein. Referring to FIG. 5, duplexer 500 can include a common node CN and band nodes BN1 and BN2. Common node CN can be connected to an antenna. Band node BN1 can be connected to transmission circuitry. Band node BN2 can be connected to reception circuitry. Duplexer 500 can include transmission component TC connected between common node CN and band node BN1. Further, duplexer 500 can include reception component RC connected between common node CN and band node BP2. In one embodiment, the transmission frequency can be about 1.85 GHz, and the reception frequency can be about 1.93 GHz in accordance with the United State PCS handset bands. Other exemplary frequency bands addressable with the subject matter described herein include U.S. Cellular, Korean PCS, Japan Cellular, European GSM and European DCS bands. Further, any other wireless standard utilizing frequency duplexing can be addressed with the subject matter described herein.

Transmission component TC can include an arrangement of pole-zero elements 100 and 400 shown in FIGS. 1 and 4, respectively. Three of pole-zero elements 100 shown in FIG. 1 can be arranged in series. Further, two of pole-zero elements 400 shown in FIG. 4 can be connected between a ground G and nodes N1 and N2. Pole-zero elements 100 and 400 in transmission component TC can operate to pass transmission signals to transmission circuitry connected to band node BN1. Further, pole-zero elements 100 and 400 can operate to block reception signals.

Reception component RC can include pole-zero elements 200 and 300 shown in FIGS. 2 and 3, respectively. Three of pole-zero elements 200 shown in FIG. 2 can be arranged in series. Further, two of pole-zero elements 300 shown in FIG. 3 can be connected between ground G and nodes N3 and N4. Pole-zero elements 200 and 300 in reception component RC can operate to block transmission signals. Further, pole-zero elements 200 and 300 can operate to pass reception signals to reception circuitry connected to band node BN2.

In one embodiment, duplexer 500 can be a tunable duplexer including one or more variable capacitors or inductors for adjusting the frequency response of the pole-zero elements. For example, one or more of the capacitors may be variable capacitors that can be varied together for shifting the frequency response. By varying the capacitors, variations in the manufacture of inductors can be compensated. Further, in reception component RC, the capacitors can be precisely varied to tune receive filter zeros for maximizing transmission rejection.

In one embodiment, the pole-zero elements of tunable duplexer 500 can include variable capacitors VC for adjusting the frequency response of the pole-zero elements. The capacitance values of the variable capacitors can be varied together for shifting the frequency response of tunable duplexer 500.

Figure 6:
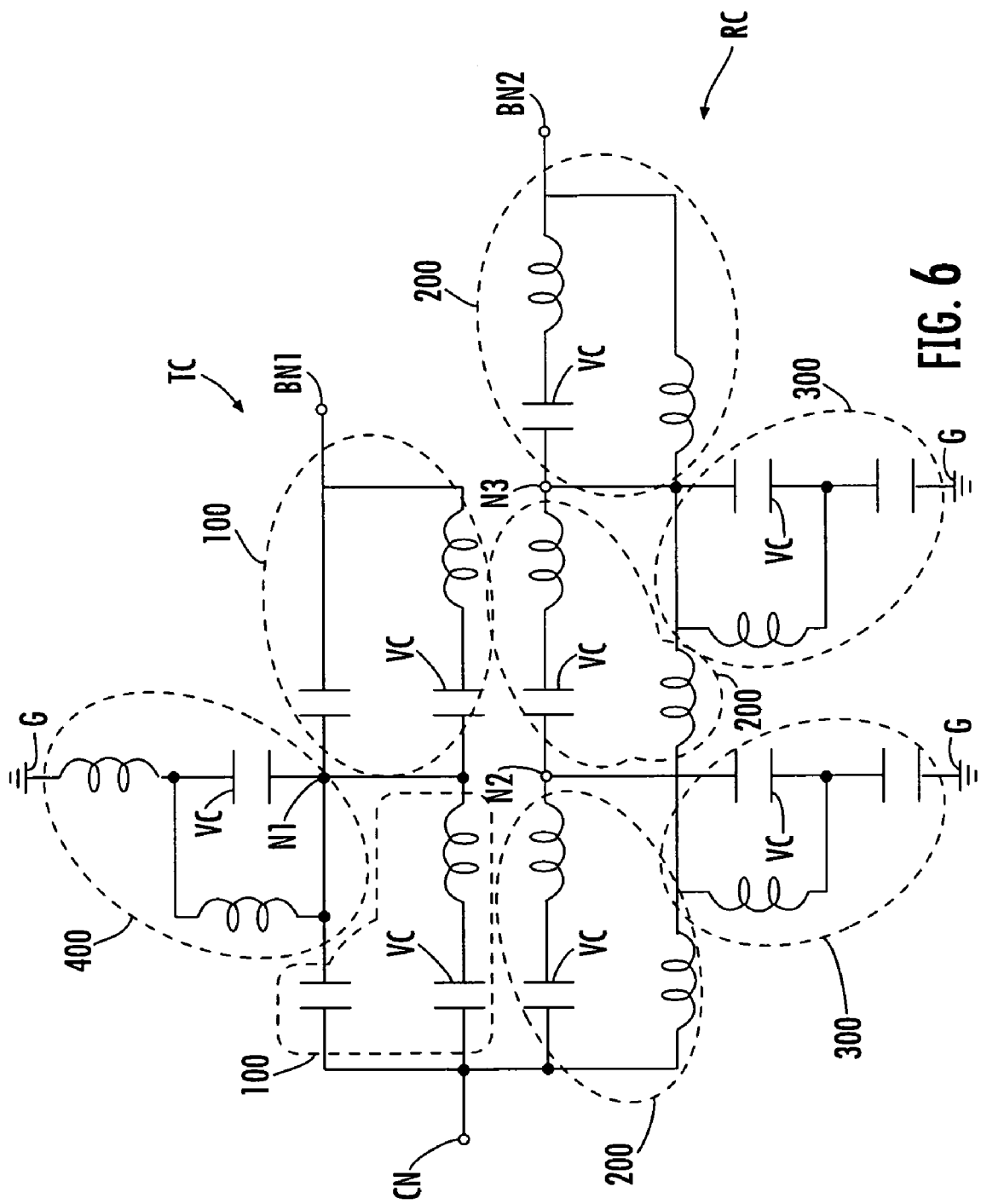
FIG. 6 is a schematic diagram of another exemplary tunable duplexer including pole-zero elements according to one embodiment of the subject matter described herein.

FIG. 6 illustrates a schematic diagram of another exemplary tunable duplexer 600 including pole-zero elements according to one embodiment of the subject matter described herein. Referring to FIG. 6, tunable duplexer 600 can include a common node CN and band nodes BN1 and BN2. Common node CN can be connected to an antenna. Band node BN1 can be connected to transmission circuitry. Band node BN2 can be connected to reception circuitry. Duplexer 600 can include transmission component TC connected between common node CN and band node BN1. Further, tunable duplexer 600 can include reception component RC connected between common node CN and band node BP2.

Transmission component TC can include pole-zero elements 100 and 400 shown in FIGS. 1 and 4, respectively. Two of pole-zero elements 100 shown in FIG. 1 can be arranged in series. Further, pole-zero element 400 shown in FIG. 4 can be connected between a ground G and a node N1. Pole-zero elements 100 and 400 in transmission component TC can operate to pass transmission signals to transmission circuitry connected to band node BN1. Further, pole-zero elements 100 and 400 can operate to block reception signals.

Reception component RC can include pole-zero elements 200 and 300 shown in FIGS. 2 and 3. Three of pole-zero elements 200 shown in FIG. 2 can be arranged in series. Further, two of pole-zero elements 300 shown in FIG. 3 can be connected between ground G and nodes N3 and N4. Pole-zero elements 200 and 300 in reception component RC can operate to block transmission signals. Further, pole-zero elements 200 and 300 can operate to pass reception signals to reception circuitry connected to band node BN2.

In one embodiment, the pole-zero elements of tunable duplexer 600 can include variable capacitors VC for adjusting the frequency response of the pole-zero elements. The capacitance values of the variable capacitors can be varied together for shifting the frequency response of tunable duplexer 600.

Figure 7:
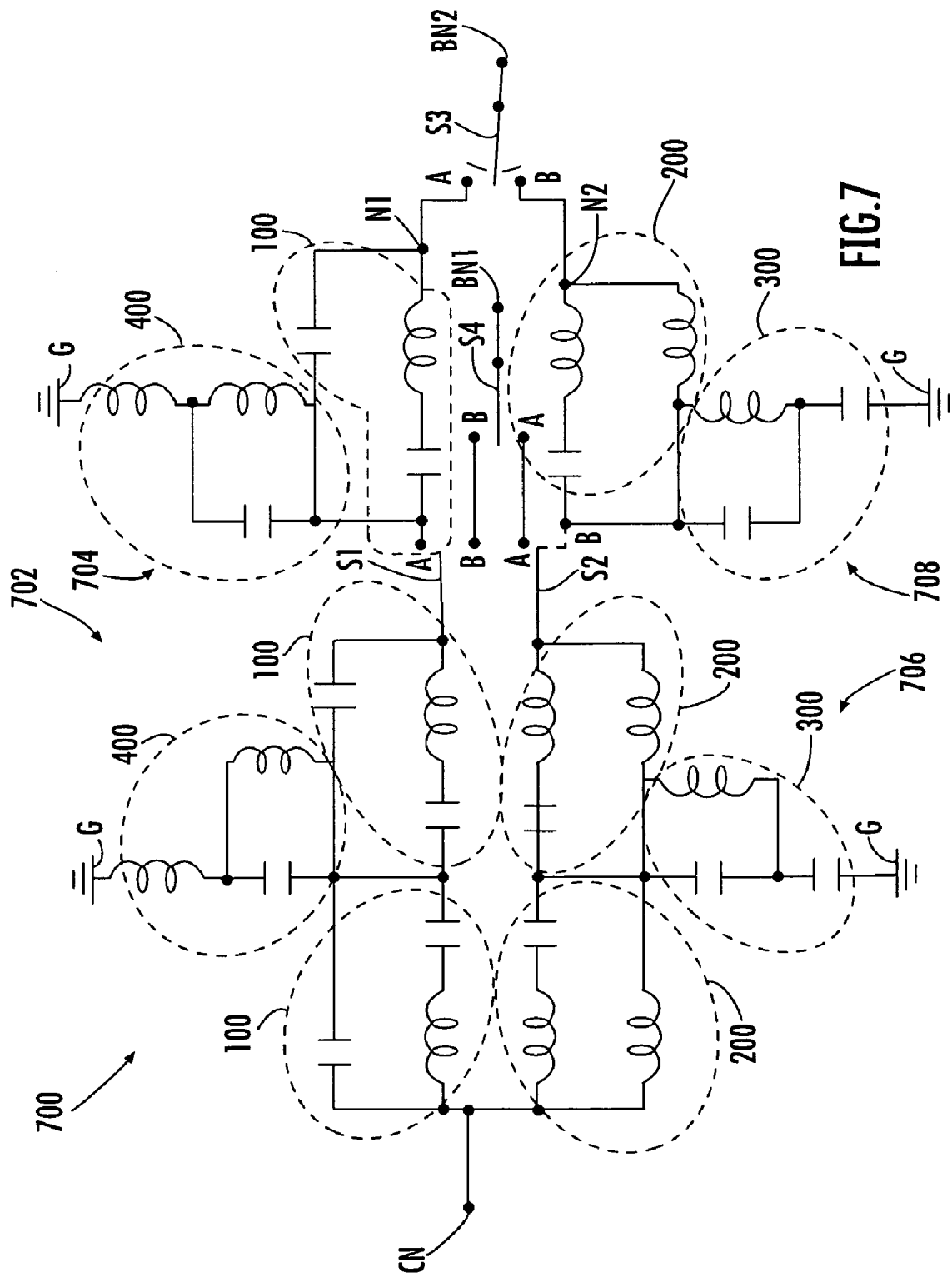
FIG. 7 is a schematic diagram of another exemplary tunable duplexer including pole-zero elements according to one embodiment of the subject matter described herein.

FIG. 7 illustrates a schematic diagram of another exemplary tunable duplexer 700 including pole-zero elements according to one embodiment of the subject matter described herein. Referring to FIG. 7, tunable duplexer 700 can include a common node CN and band nodes BN1 and BN2. Common node CN can be connected to an antenna. Band node BN1 can be connected to transmission circuitry. Band node BN2 can be connected to reception circuitry.

Duplexer 700 can include pole-zero elements 100, 200, 300, and 400 shown in FIGS. 1, 2, 3, and 4, respectively. Pole-zero elements 100 and 400 (generally designated 702) can be connected between common node CN and a switch S1. Pole-zero elements 100 and 400 (generally designated 704) can be connected between a node N1 and switch S1. Pole-zero elements 200 and 300 (generally designated 706) can be connected between common node CN and a switch S2. Pole-zero elements 200 and 300 (generally designated 708) can be connected between a node N2 and switch S2.

Band node BN2 can be controllably connected to nodes N1 or N2 via a switch S3. Further, band node BN1 can be controllably connected to the pole-zero nodes designated 702 or 706 via switches S1 and S2 and a switch S4. Switches S1, S2, and S3 can be controlled to close in the same direction while switch S4 closes in an opposite direction for operation in accordance with the U.S. cell band mode and in accordance with Japanese CDMA (JCDMA) mode. In one embodiment, switches S1-S4 are connected to a respective position A or B at the same time. By switching modes, the order of transmit and receive frequency bands are reversed because the frequency bands are reversed in the U.S. cell band and JCDMA modes. The switching also connects the proper radio component following the duplexer to the corresponding duplexer terminal (typically, power amplifier filtered output to the transmitter and filtered LNA input to the receiver).

In an alternate, embodiment band node N1 can be directly connected to switches S2 and switch S4 removed. In this embodiment, switches S1, S2, and S3 can be controlled to move in the same direction for switching between the different operating modes.

According to one embodiment of the subject matter described herein, the tunable duplexer can include pole-zero elements composed of several different types of capacitors and inductors. For example, the tunable duplexer can include a continuously variable capacitor, a switched fixed capacitor array, a two-state capacitor bank, one or more high-power series switches connected to fixed capacitors, and/or high power shunt switches including a capacitor for tuning each pole-zero element. Further, for example, acoustic resonators, such as a film bulk acoustic resonator (FBAR), can include a pole-zero response.

According to one embodiment of the subject matter described herein, the pole-zero elements can include one or more MEMS capacitors and/or inductors. MEMS capacitors and inductors can be fabricated by either bulk or surface micromachining techniques. Bulk micromachining generally involves sculpting one or more sides of a substrate to form desired three dimensional structures and devices in the same substrate material. The substrate can be made of a material that is readily available in bulk form, such as silicon or glass. Wet and/or dry etching techniques can be employed in association with etch masks and etch stops to form the microstructures. Etching can be performed through the backside of the substrate. The etching technique can be either isotropic or anisotropic in nature. Etch masks and etch stops are used to prevent predetermined regions of the substrate from being etched.

Surface micromachining generally involves forming three-dimensional structures by depositing a number of different thin films on the top of a silicon wafer, but without sculpting the wafer itself. The films can serve as either structural or sacrificial layers. Examples of structural layer material include polysilicon, silicon nitride, silicon dioxide, silicon carbide, or aluminum. Examples of sacrificial layer material include polysilicon, photoresist material, polimide, metals, or various types of oxides, such as PSG (phosphosilicate glass) and LTO (low-temperature oxide). Successive deposition, etching, and patterning procedures can be carried out to arrive at the desired microstructure. In an exemplary surface micromachining process, a silicon substrate is coated with an isolation layer, and a sacrificial layer is deposited on the coated substrate. Windows are opened in the sacrificial layer, and a structural layer is then deposited and etched. The sacrificial layer is then selectively etched to form a free-standing, movable microstructure such as a beam or a cantilever out of the structural layer. The microstructure is ordinarily anchored to the silicon substrate, and can be designed to be movable in response to an input from an appropriate actuating mechanism.

It is understood that when a component such as a layer, substrate, contact, interconnect, electrode, capacitive plate, or conductive line is referred to herein as being deposited or formed "on" another component, that component can be directly on the other component or, alternatively, intervening components (for example, one or more buffer or transition layers, interlayers, electrodes or contacts) can also be present. Furthermore, it is understood that the terms "disposed on", "attached to" and "formed on" are used interchangeably to describe how a given component is positioned or situated in relation to another component. Therefore, it will be understood that the terms "disposed on", "attached to" and "formed on" do not introduce any limitations relating to particular methods of material transport, deposition, or fabrication.

Contacts, interconnects, electrodes, capacitive plates, conductive lines, and other various conductive elements of various metals can be formed by sputtering, CVD, or evaporation. If gold, copper, nickel or Permalloy™ ($Ni_xFe_y$) is employed as the metal element, an electroplating process can be carried out to transport the material to a desired surface. The chemical solutions used in the electroplating of various metals are generally known. Some metals, such as gold, might require an appropriate intermediate adhesion layer to prevent peeling. Examples of adhesion material often used include chromium, titanium, or an alloy such as titanium-tungsten (TiW). Some metal combinations can require a diffusion barrier to prevent a chromium adhesion layer from diffusing through gold. Examples of diffusion barriers between gold and chromium would include platinum or nickel.

Conventional lithographic techniques can be employed in accordance with micromachining of the variable capacitors. Accordingly, basic lithographic process steps such as photoresist application, optical exposure, and the use of developers are not described in detail herein.

Similarly, generally known-etching processes can be employed to selectively remove material or regions of material. An imaged photoresist layer is ordinarily used as a masking template. A pattern can be etched directly into the bulk of a substrate, or into a thin film or layer that is then used as a mask for subsequent etching steps.

The type of etching process employed in a particular fabrication step (e.g., wet, dry, isotropic, anisotropic, anisotropic-orientation dependent), the etch rate, and the type of etchant used will depend on the composition of material to be removed, the composition of any masking or etch-stop layer to be used, and the profile of the etched region to be formed. As examples, poly-etch ($HF:HNO_3:CH_3COOH$) can generally be used for isotropic wet etching. Hydroxides of alkali metals (e.g., KOH), simple ammonium hydroxide ($NH_4OH$), quaternary (tetramethl) ammonium hydroxide ($(CH_3)_4NOH$, also known commercially as TMAH), and ethylenediamine mixed with pyrochatechol in water (EDP) can be used for anisotropic wet etching to fabricate V-shaped or tapered grooves, trenches or cavities. Silicon nitride is typically used as the masking material against etching by KOH, and thus can be used in conjunction with the selective etching of silicon. Silicon dioxide is slowly etched by KOH, and thus can be used as a masking layer if the etch time is short. While KOH will etch undoped silicon, heavily doped (p++) silicon can be used as an etch-stop against KOH as well as the alkaline etchants and EDP. The preferred metal used to form contacts and interconnects is gold, which is resistant to EDP. The adhesion layer applied in connection with forming a gold component (e.g., chromium) is also resistant to EDP.

It will be appreciated that electrochemical etching in hydroxide solution can be performed instead of timed wet etching. For example, if a p-type silicon wafer is used as a substrate, an etch-stop can be created by epitaxially growing an n-type silicon end layer to form a p-n junction diode. A voltage is applied between the n-type layer and an electrode disposed in the solution to reverse-bias the p-n junction. As a result, the bulk p-type silicon is etched through a mask down to the p-n junction, stopping at the n-type layer. Furthermore, photovoltaic and galvanic etch-stop techniques are also suitable.

Dry etching techniques such as plasma-phase etching and reactive ion etching (RIE) can also be used to remove silicon and its oxides and nitrides, as well as various metals. Deep reactive ion etching (DRIE) can be used to anisotropically etch deep, vertical trenches in bulk layers. Silicon dioxide is typically used as an etch-stop against DRIE, and thus structures containing a buried silicon dioxide layer, such as silicon-on-insulator (SOI) wafers, can be used as starting substrates for the fabrication of microstructures.

An alternative patterning process to etching is the lift-off process. In this case, the conventional photolithography techniques are used for the negative image of the desired pattern. This process is typically used to pattern metals, which are deposited as a continuous film or films when adhesion layers and diffusion barriers are needed. The metal is deposited on the regions where it is to be patterned and on top of the photoresist mask (negative image). The photoresist and metal on top are removed to leave behind the desired pattern of metal.

As used herein, the term "device" is interpreted to have a meaning interchangeable with the term "component".

As used herein, the term "conductive" is generally taken to encompass both conducting and semi-conducting materials.

Figure 8A:
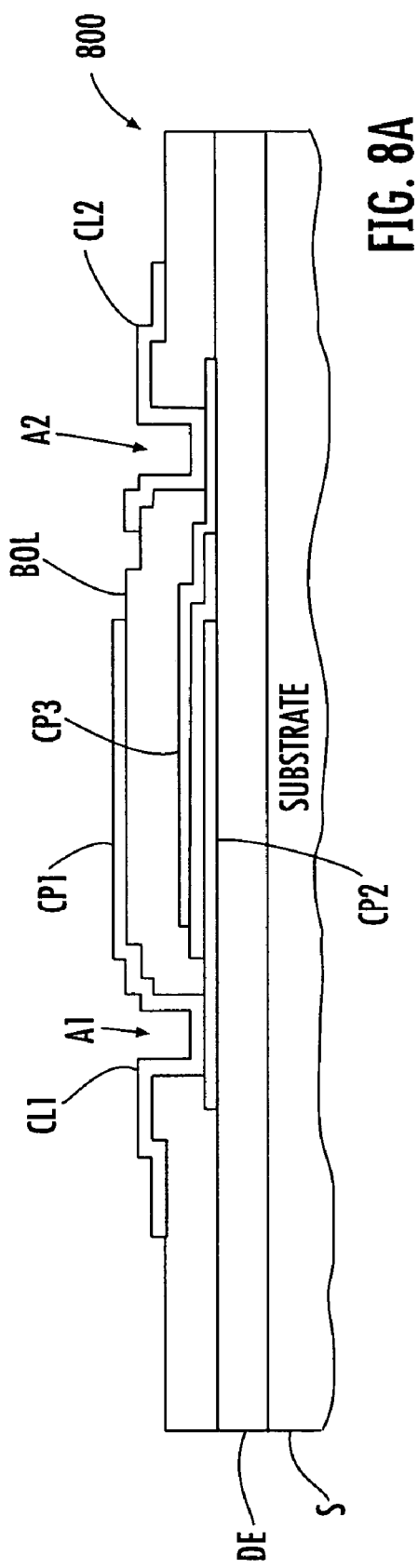
FIGS. 8A and 8B are different views of a MEMS fixed capacitor according to one embodiment of the subject matter described herein.
Figure 8B:
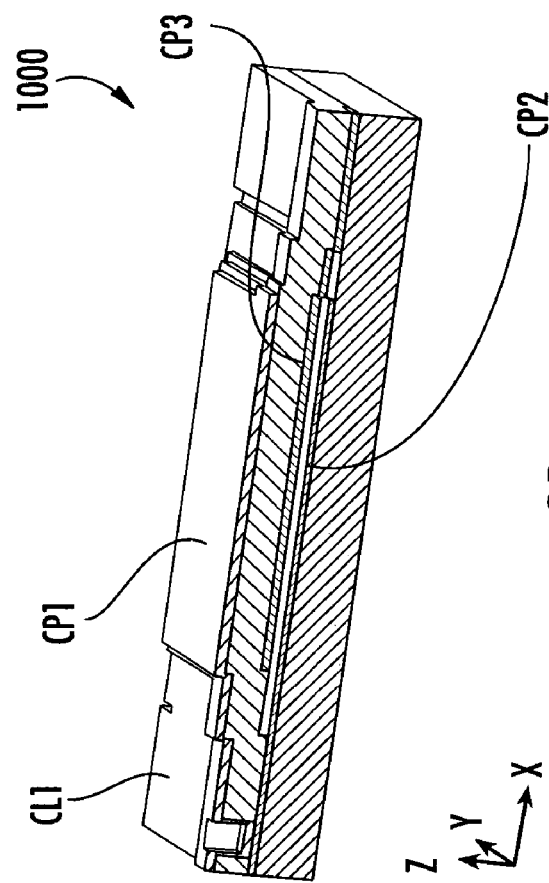

FIGS. 8A and 8B illustrate different views of a MEMS fixed capacitor 800 according to one embodiment of the subject matter described herein. In particular, FIG. 8A illustrates a cross-sectional side view of MEMS fixed capacitor 800. FIG. 8B illustrates a top perspective view of MEMS fixed capacitor 800. Referring to FIG. 8A, capacitor 800 can include first and second capacitive plates CP1 and CP2 that can be connected to one another via a conductive line CL1 and in electrical communication with one another. Capacitor 800 can also include a third capacitive plate CP3 positioned between capacitive plates CP1 and CP2. Third capacitive plate CP3 can be connected to a conductive line CL2 and in electrical communication with conductive line CL2. Capacitive plates CP1, CP2, and CP3 are stationary with respect to one another. Thus, capacitor 800 can have a fixed capacitance value. Conductive lines CL1 and CL2 can be connected to a signal line.

In one embodiment, capacitor 800 can be fabricated on a substrate S and a layer of dielectric DE. Capacitive plate CP2 can be formed on a top surface of dielectric DE. In particular, for example, a conductive layer can be deposited on dielectric DE and the conductive layer can be etched to form capacitive plate CP2 and a portion of conductive line CL2. After the formation of capacitive plate CP2, a sacrificial layer can be deposited on capacitive plate CP2 and dielectric DE. Next, another conductive layer can be deposited on the sacrificial layer and the same conductive layer etched to form capacitive plate CP3 and a portion of conductive line CL2. In one embodiment, the sacrificial layer can be about 0.5 µm in thickness or any other suitable thickness.

A beam oxide layer BOL can be deposited on capacitive plate CP3, the sacrificial layer, and dielectric DE. Further, beam oxide layer BOL can be etched to form apertures A1 and A2 that extend through beam oxide layer BOL to respective portions of conductive lines CL1 and CL2. The sacrificial layer disposed between capacitive plates CP2 and CP3 can be etched to form an air gap between capacitive plates CP2 and CP3. In one embodiment, beam oxide layer BOL can be about 2 µm in thickness or any other suitable thickness.

Capacitive plate CP1 and other portions of conductive lines CL1 and CL2 can be formed by depositing a conductive layer on beam oxide layer BOL and in apertures A1 and A2. The deposited conductive layer can be etched to form capacitive plate CP1. Further, the conductive layer can be etched to complete the formation of conductive lines CL1 and CL2.

Figure 9A:
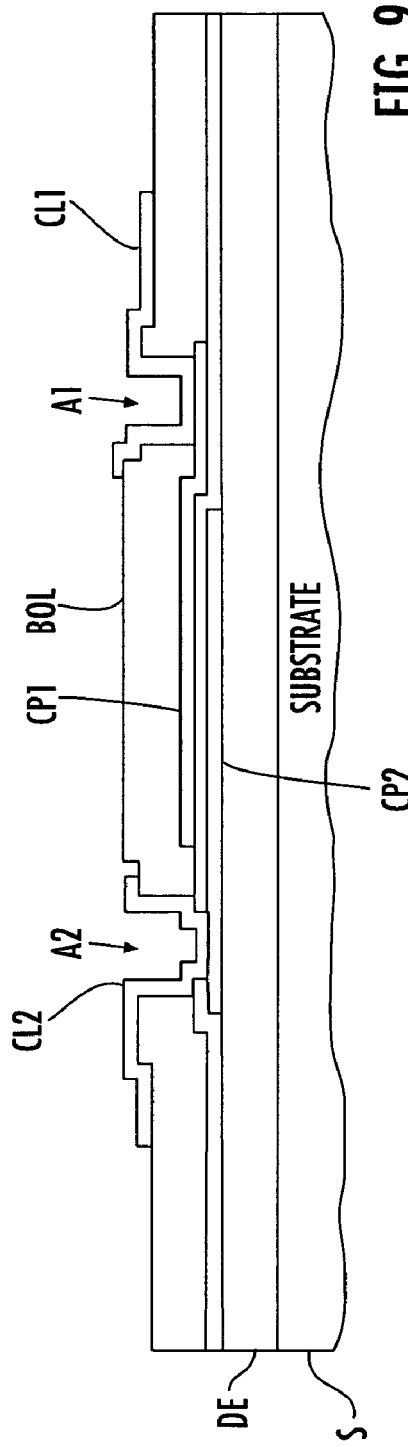
FIGS. 9A and 9B are different views of another MEMS fixed capacitor according to one embodiment of the subject matter described herein.
Figure 9B:
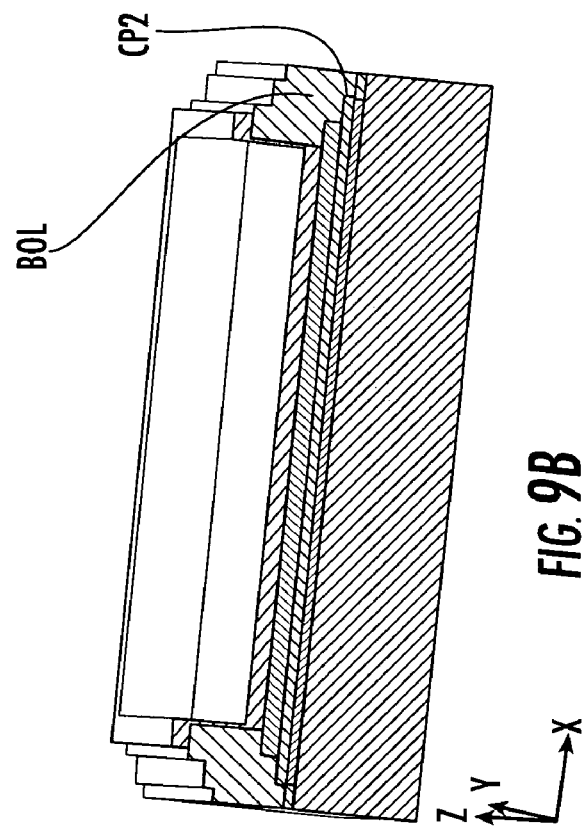

FIGS. 9A and 9B illustrate different views of another MEMS fixed capacitor 900 according to one embodiment of the subject matter described herein. In particular, FIG. 9A illustrates a cross-sectional side view of MEMS fixed capacitor 900. FIG. 9B illustrates a top perspective view of MEMS fixed capacitor 900. Referring to FIG. 9A, capacitor 900 can include first and second capacitive plates CP1 and CP2 that are connected to conductive lines CL1 and CL2, respectively. Capacitive plates CP1 and CP2 are stationary with respect to one another. Thus, capacitor 900 can have a fixed capacitance value. Conductive lines CL1 and CL2 can be connected to a signal line.

In one embodiment, capacitor 900 can be fabricated on a substrate S and a layer of dielectric DE. In particular, for example, a conductive layer can be formed on dielectric DE and the conductive layer can be etched to form capacitive plate CP2 and a portion of conductive line CL2. After the formation of capacitive plate CP2, a thin (<1 micron) dielectric layer can be added to provide a precise and high capacitance value for fixed and switchable capacitors. Another conductive layer can be deposited on the SIP layer and capacitive plate CP1. The conductive layer can be etched to form capacitive plate CP1 and a portion of conductive line CL1. In one embodiment, the SIP layer can be about 0.25 µm in thickness or any other suitable thickness.

A beam oxide layer BOL can be deposited on capacitive plate CP1 and the SIP layer. Further, beam oxide layer BOL can be etched to form apertures A1 and A2 that extend through beam oxide layer BOL to respective portions of conductive lines CL1 and CL2. In one embodiment, beam oxide layer BOL can be about 2 µm in thickness or any other suitable thickness. Other portions of conductive lines CL1 and CL2 can be formed by depositing a conductive layer on beam oxide layer BOL and in apertures A1 and A2. The deposited conductive layer can be etched to form the other portions of conductive lines CL1 and CL2.

Figure 10A:
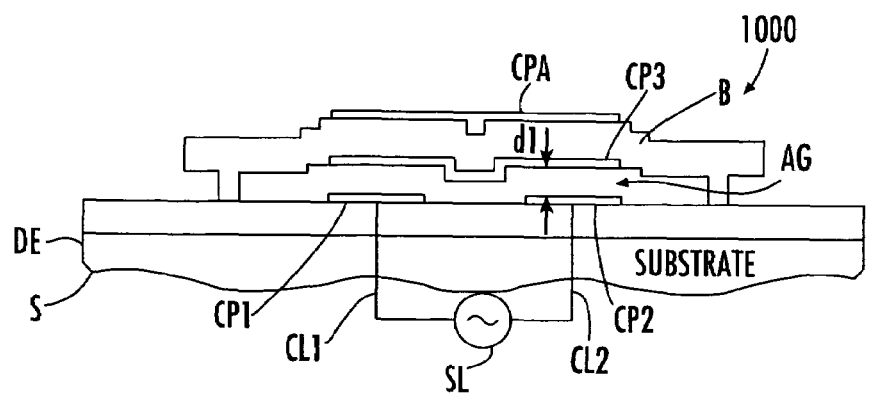
FIGS. 10A, 10B, and 10C illustrate different views of a MEMS switched capacitor according to one embodiment of the subject matter described herein.
Figure 10B:
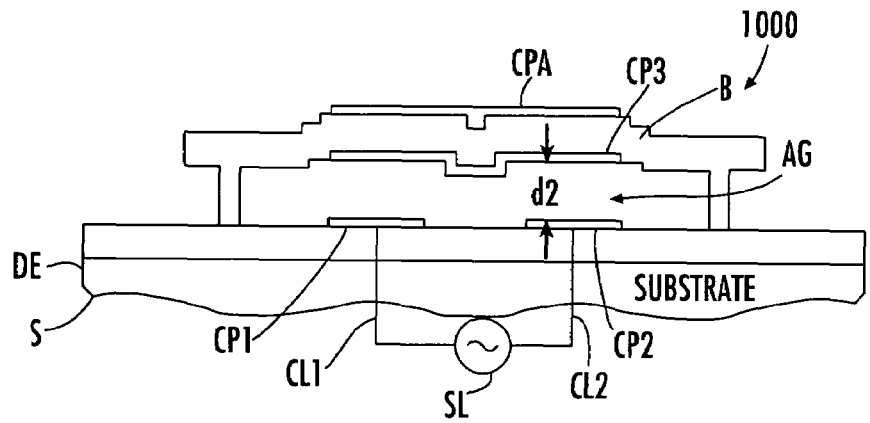
Figure 10C:
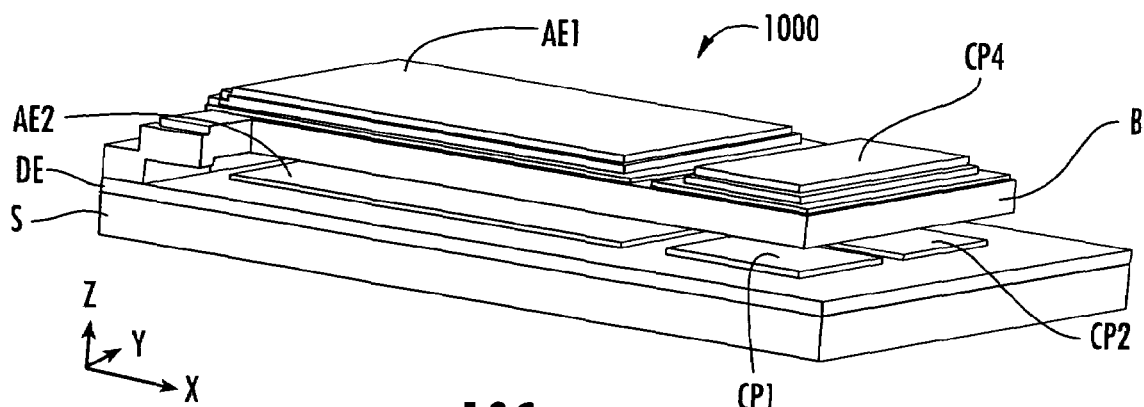

FIGS. 10A, 10B, and 10C illustrate different views of a MEMS switched capacitor 1000 according to one embodiment of the subject matter described herein. In particular, FIG. 10A is a cross-sectional front view of capacitor 1000 in a closed position. Referring to FIG. 10A, switched capacitor 1000 can include first and second capacitive plates CP1 and CP2 disposed on a surface of a dielectric layer DE. Capacitive plates CP1 and CP2 can be connected to conductive lines CL1 and CL2, respectively. The conductive lines CL1 and CL2 can be connected to a signal line SL. A third capacitive plate CP3 can be positioned on an opposing side of an air gap AG from capacitive plates CP1 and CP2 to form a capacitance across conductive lines CL1 and CL2. Third capacitive plate CP3 can be spaced from capacitive plates CP1 and CP2 by a distance d1 in the closed position. The distance between plate CP3 and capacitive plates CP1 and CP2 can be about 0.5 to 4 microns. FIG. 10B is a cross-sectional front view of capacitor 1000 in an open position, wherein third capacitive plate CP3 can be spaced from capacitive plates CP1 and CP2 by a distance d2.

FIG. 10C is a top perspective view of capacitor 1000. Referring to FIG. 10C, the capacitance of capacitor 1000 can be varied by applying varying voltage across actuation electrodes AE1 and AE2. When voltage is applied across actuation electrodes AE1 and AE2, a beam B can deflect towards substrate S. As a result of the deflection, the distance between capacitive plates CP1 and CP2 narrows, and therefore, the capacitance changes. Capacitor 1000 can also include an actuation electrode (not shown) on an opposing side of beam B from actuation electrode AE1 and electrically connected to actuation electrode AE1 for deflecting beam B towards substrate S on application of the voltage.

In one embodiment, capacitor 1000 can be fabricated on a substrate S and dielectric DE. In particular, for example, conductive lines CL1 and CL2 can be buried within substrate S and/or dielectric DE and include ends that extend to a surface of dielectric DE. A conductive layer can be deposited over the top surface of dielectric DE and the ends of conductive lines CL1 and CL2. The conductive layer can be etched to form capacitive plates CP1 and CP2 on the ends of conductive lines CL1 and CL2, respectively.

A sacrificial layer can be deposited on capacitive plates CP1 and CP2 and dielectric DE. Next, apertures A1 and A2 can be etched in the sacrificial layer through to the surface of dielectric DE. A beam B can be formed by depositing a layer of oxide on capacitive plate CP3, the sacrificial layer, and in apertures A1 and A2 through to the surface of dielectric DE. The sacrificial layer can be removed to form an air gap between capacitive plate CP3 and capacitive plates CP1 and CP2. The air gap can be varied to achieve different capacitances. Further, a conductive layer can be formed on beam B and the conductive layer etched to form a third capacitive plate CP4.

Figure 11A:
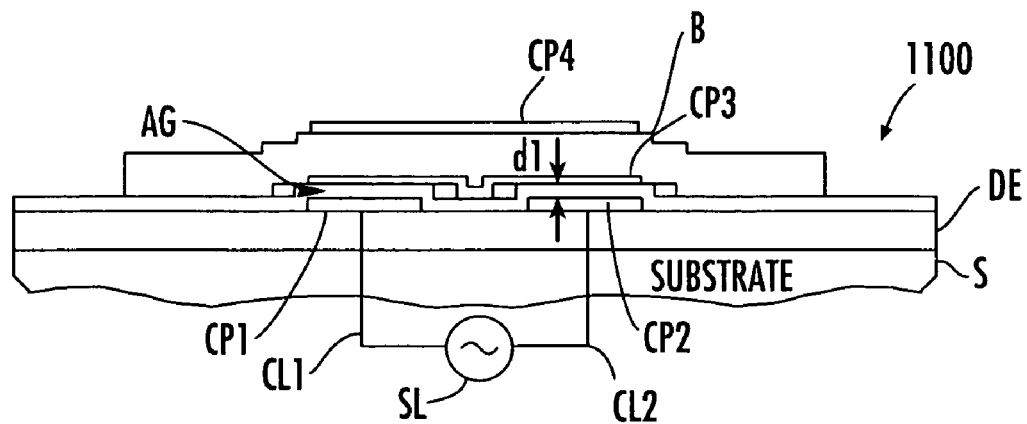
FIGS. 11A and 11B are different views of another MEMS switched capacitor according to one embodiment of the subject matter described herein.
Figure 11B:
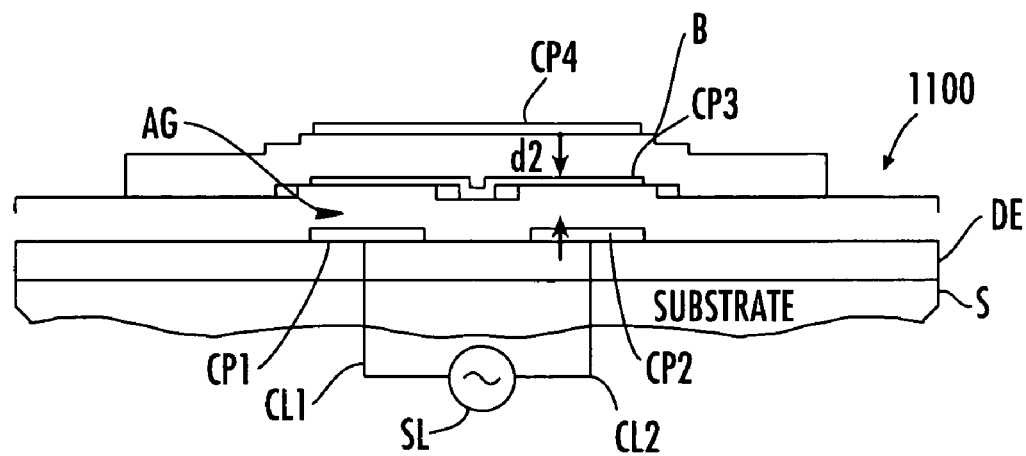

FIGS. 11A and 11C illustrate different views of a MEMS switched capacitor 1100 according to one embodiment of the subject matter described herein. In particular, FIG. 11A illustrates a cross-sectional front view of capacitor 1100 in a closed position. Referring to FIG. 11A, switched capacitor 1100 can include first and second capacitive plates CP1 and CP2 disposed on a surface of a dielectric layer DE. Capacitive plates CP1 and CP2 can be connected to conductive lines CP1 and CL2, respectively. The conductive lines CL1 and CL2 can be connected to a signal line. A third capacitive plate CP3 can be positioned on an opposing side of an air gap AG from capacitive plates CP1 and CP2 to form a capacitance across conductive lines CL1 and CL2. Third capacitive plate CP3 can be spaced from capacitive plates CP1 and CP2 by a distance dl in the closed position. The distance between plate CP3 and capacitive plates CP1 and CP2 can be about 0.5 to 4 microns. FIG. 11B is a cross-sectional front view of capacitor 1100 in an open position, wherein third capacitive plate CP3 can be spaced from capacitive plates CP1 and CP2 by a distance d2.

Capacitor 1100 can include a fourth capacitive electrode CP4 disposed on a beam B. Further, similar to capacitor 1000 shown in FIGS. 10A and 10B, capacitor 1100 can include an actuation electrode disposed on beam B and another actuation electrode disposed on substrate S for deflecting beam B toward substrate S on application of a voltage across the actuation electrodes. As a result, the capacitance across conductive lines CL1 and CL2 varies.

Figure 12A:
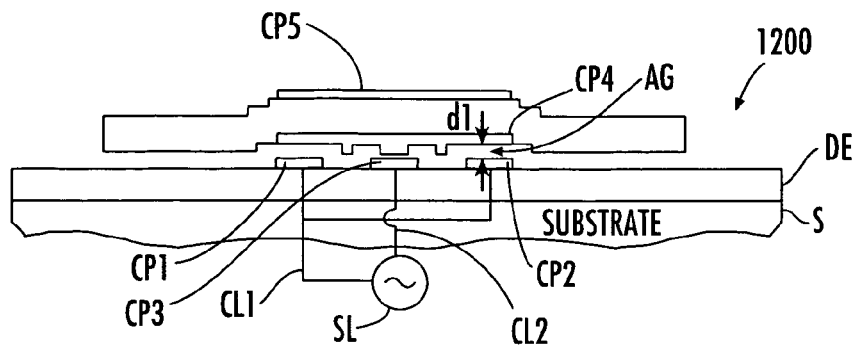
FIGS. 12A, 12B, and 12C are different views of another MEMS switched capacitor according to one embodiment of the subject matter described herein.
Figure 12B:
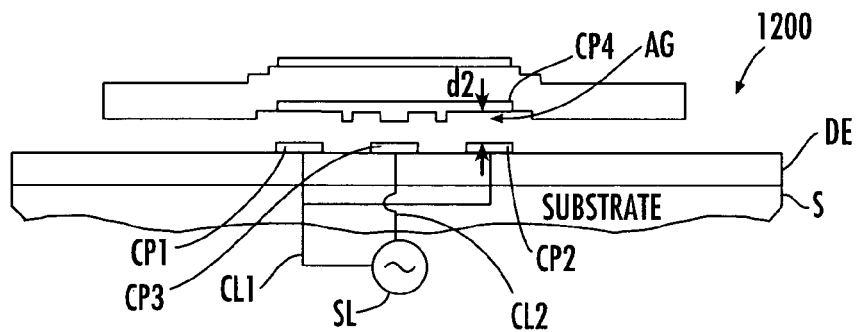
Figure 12C:
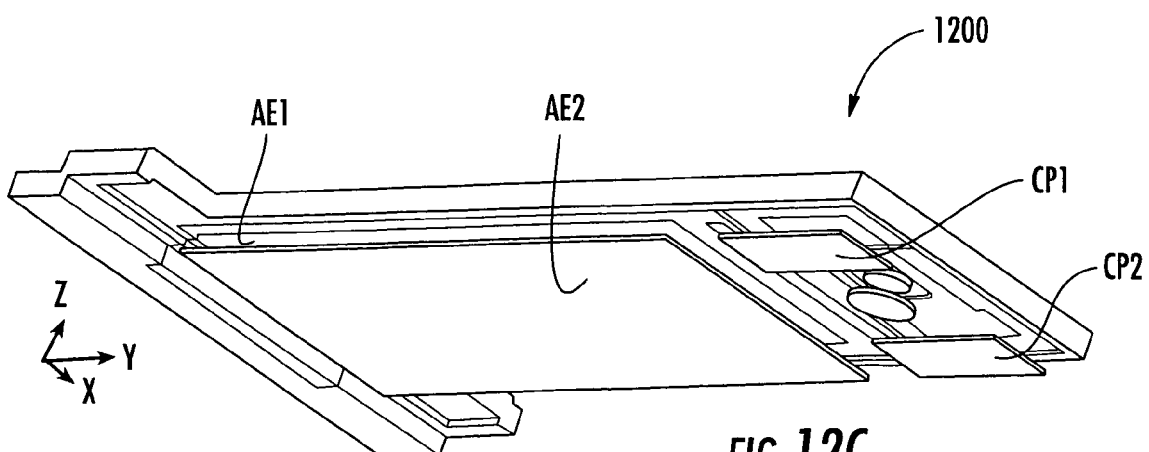

FIGS. 12A, 12B, and 12C illustrate different views of a MEMS switched capacitor 1200 according to one embodiment of the subject matter described herein. FIG. 12A is a front cross-sectional view of capacitor 1200 in a closed position. Referring to FIG. 12A, switched capacitor 1200 can include capacitive plates CP1, CP2, and CP3 disposed on a surface of a layer of dielectric DE. Capacitive plates CP1 and CP2 can be connected to a conductive line CL1. Capacitive plate CP3 can be connected to a conductive line CL3. The conductive lines CL1 and CL2 can be connected to a signal line SL. Another capacitive plate CP4 can be positioned on an opposing side of air gap AG from capacitive plates CP1 and CP2 to form a capacitance across conductive lines CP1 and CL2. Capacitive plate CP4 can be spaced from capacitive plates CP1 and CP2 by a distance d1 in the closed position. The distance between plate CP4 and capacitive plates CP1 and CP2 can be about 0.5 to 4 microns. FIG. 12B is a cross-sectional front view of capacitor 1200 in an open position, wherein third capacitive plate CP3 can be spaced from capacitive plates CP1 and CP2 by a distance d2. Capacitive plate CP4 can include one or more isolation bumps for improve stability of the capacitor and allow the gap between plates to be set precisely for achieving a precise capacitance value.

Capacitor 1200 can include another capacitive electrode CP5 disposed on a beam B. Further, similar to capacitor 1200 shown in FIGS. 10A and 10B, capacitor 1200 can include an actuation electrode AE1 disposed on beam B and another actuation electrode AE2 disposed on substrate S for deflecting beam B towards substrate S on application of a voltage across the actuation electrodes. As a result, the capacitance across conductive lines CL1 and CL2 varies. FIG. 12C is a perspective bottom view of capacitor 1200.

Figure 13:
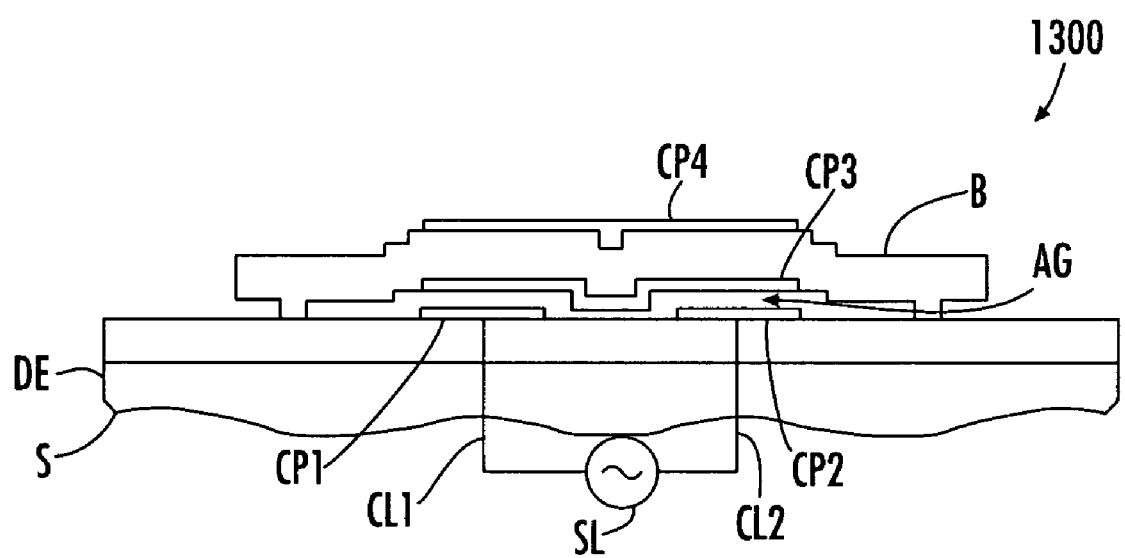
FIG. 13 is a cross-sectional front view of a MEMS switched capacitor according to one embodiment of the subject matter described herein.

FIG. 13 illustrates a cross-sectional front view of a MEMS switched capacitor 1300 according to one embodiment of the subject matter described herein. Referring to FIG. 13, capacitor 1300 can include first and second capacitive plates CP1 and CP2 disposed on a surface of a dielectric layer DE. Capacitive plates CP1 and CP2 can be connected to conductive lines CL1 and CL2, respectively. The conductive lines CL1 and CL2 can be connected to a signal line SL. A third capacitive plate CP3 can be positioned on an opposing side of an air gap AG from capacitive plates CP1 and CP2 to form a capacitance across conductive lines CL1 and CL2.

Capacitor 1300 can include a fourth capacitive electrode CP4 disposed on a beam B. Further, similar to capacitor 1000 shown in FIGS. 10A and 10B, capacitor 1300 can include an actuation electrode disposed on beam B and another actuation electrode disposed on substrate S for deflecting beam B towards substrate S on application of a voltage across the actuation electrodes. As a result, the capacitance across conductive lines CL1 and CL2 varies.

Capacitor 1300 is fabricated similar to capacitor 1000 shown in FIG. 10. One difference between the fabrication of capacitors 1000 and 1300 is air gap AG of each of the capacitors. Air gap AG is thicker in capacitor 1000 than capacitor 1300. The thickness variation can be controlled in the fabrication process by applying different thicknesses of sacrificial layers when spacing the capacitive plates.

Figure 14:
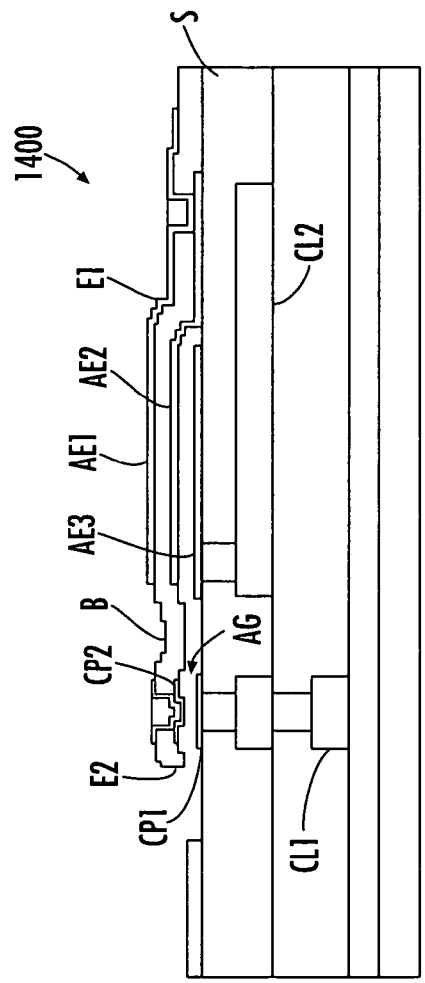
FIG. 14-16 are cross-sectional side views of different two-state capacitors according to embodiments of the subject matter described herein.
Figure 15:
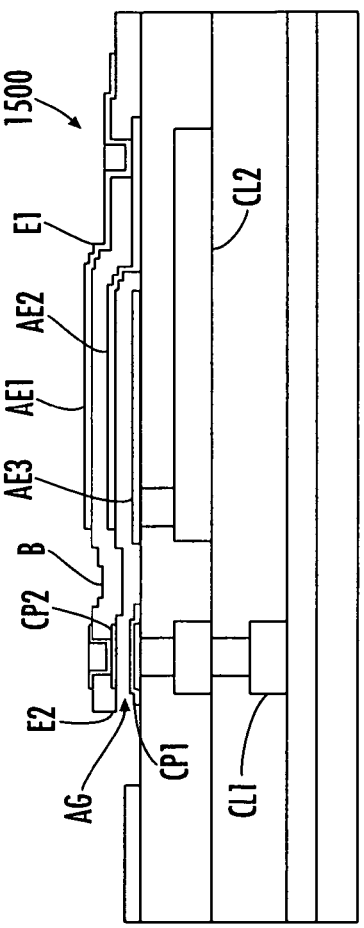
Figure 16:
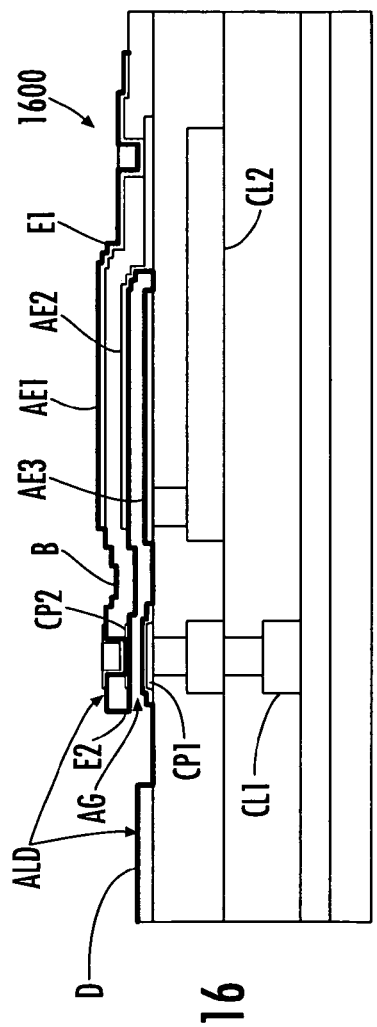

FIGS. 14, 15, and 16 illustrate cross-sectional side views of different two-state capacitors according to embodiments of the subject matter described herein. A two-state capacitor is a particular type of variable capacitor. Ideally, a two-state capacitor has one of two capacitance values in operation. Broadly, a variable capacitor can have one of a plurality of capacitance values. Referring to FIG. 14, a two-state capacitor 1400 can include a beam B connected at one end E1 to a substrate S. An opposing end E2 of beam B can be positioned over a first capacitive plate CP1. Further, end E2 can include a second capacitive plate CP2. Capacitive plates CP1 and CP2 can be positioned at opposing sides of an air gap AG to result in a capacitance. Capacitor 1400 can include a conductive line CL1 buried within substrate S and connected to capacitive plate CP1.

Beam B of capacitor 1400 can include actuation electrodes AE1 and AE2 positioned on opposing sides of beam B. Further, another actuation electrode AE3 can be disposed on a surface of substrate S. A voltage can be applied across actuation electrode AE3 and actuation electrodes AE1 and AE2 for deflecting beam B towards substrate S. As a result, the distance between capacitive plates CP1 and CP2 narrows, and the capacitance between capacitive plates CP1 and CP2 changes. Capacitor 1400 can include a conductive line CL2 buried within substrate S and connected to actuation electrode AE3.

Referring to FIG. 15, a two-state capacitor 1500 can include a beam B connected at one end E1 to a substrate S. An opposing end E2 of beam B can be positioned over a first capacitive plate CP1. Further, end E2 can include a second capacitive plate CP2. Capacitive plates CP1 and CP2 can be positioned at opposing sides of an air gap AG to result in a capacitance. Capacitor 1500 can include a conductive line CL1 buried within substrate S and connected to capacitive plate CP1.

Beam B of capacitor 1500 can include actuation electrodes AE1 and AE2 positioned on opposing sides of beam B. Further, another actuation electrode AE3 can be disposed on a surface of substrate S. A voltage can be applied across actuation electrode AE3 and actuation electrodes AE1 and AE2 for deflecting beam B towards substrate S. As a result, the distance between capacitive plates CP1 and CP2 narrows, and the capacitance between capacitive plates CP1 and CP2 changes. Capacitor 1500 can include a conductive line CL2 buried within substrate S and connected to actuation electrode AE3.

Capacitor 1500 can also include a SIP layer SL disposed on capacitive plate CP1 for covering capacitive plate CP1. SIP layer SL can be a coating of one or more layers including $SiO_2$, $Si_3N_4$, SiON, $Ta_2O_5$, HfO, and/or $Al_2O_3$. SIP layer SL can include other suitable materials and layers for providing different capacitance densities, leakage, breakdown, and reliability of capacitor 1500.

Referring to FIG. 16, a two-state capacitor 1600 can include a beam B connected at one end E1 to a substrate S. An opposing end E2 of beam B can be positioned over a first capacitive plate CP1. Further, end E2 can include a second capacitive plate CP2. Capacitive plates CP1 and CP2 can be positioned at opposing sides of an air gap AG to result in a capacitance. Capacitor 1600 can include a conductive line CP1 buried within substrate S and connected to capacitive plate CP1.

Beam B of capacitor 1600 can include actuation electrodes AE1 and AE2 positioned on opposing sides of beam B. Further, another actuation electrode AE3 can be disposed on a surface of substrate S. A voltage can be applied across actuation electrode AE3 and actuation electrodes AE1 and AE2 for deflecting beam B towards substrate S. As a result, the distance between capacitive plates CP1 and CP2 narrows, and the capacitance between capacitive plates CP1 and CP2 changes. Capacitor 1600 can include a conductive line CL2 buried within substrate S and connected to actuation electrode AE3.

Capacitor 1600 can also include an atomic layer deposition (ALD) D disposed on a majority of the surfaces of capacitor 1600. According to one embodiment, ALD D can be made of $AL_2O_3$. The thickness of ALD D can be about 10 nm or any other suitable thickness. One of the advantages of the ALD process is that it is applicable to many different materials including metals, dielectrics, and barriers that can be deposited on different materials. The process is self-limiting and allows high aspect ratio conformal deposition (important to MEMS devices). ALD D can be a thin, high-k material (for example $SiO_2$, $Si_3N_4$, $Al_2O_3$, $Y_2O_3$, $La_2O_3$, $Ta_2O_3$, $TiO_2$, $HfO_2$, or $ZrO_2$ with dielectric constants of 3.9 to 25). The ALD process allows precise deposition of thin dielectric layers that are pin hole free. The ALD coatings have been shown to improve reliability in MEMS devices by reducing stiction, reducing wear, reducing static charge, and reducing inelastic thermal effects in metals.

The capacitors of FIGS. 8A-16 can be utilized in the pole-zero elements of the tunable duplexers, phase shifters, tunable matching networks, reconfigurable power amplifiers, and other suitable systems using pole-zero elements as described herein. Further, any other suitable capacitors can be utilized in a pole-zero element. Other suitable capacitors are described in detail in commonly assigned, co-pending U.S. patent application Ser. No. 10/461,021, filed Jun. 13, 2002, the disclosure of which is incorporated herein by reference in its entirety.

In an alternative embodiment, a capacitor having a substrate and beam structure similar to the capacitors shown in FIGS. 10A-10C can be employed. The capacitor can have two capacitive plates with one plate being attached to the movable end of the beam. The other plate can be attached to a surface of the substrate and positioned beneath the plate attached to the beam. One conductive line can be attached to the plate one the beam and extend along the beam. Another conductive line can be attached to the plate on the substrate surface and extend beneath the substrate surface. This capacitor embodiment can also be used in the pole-zero elements of the tunable duplexers, phase shifters, tunable matching networks, reconfigurable power amplifiers, and other suitable systems using pole-zero elements as described herein.

Figure 17:
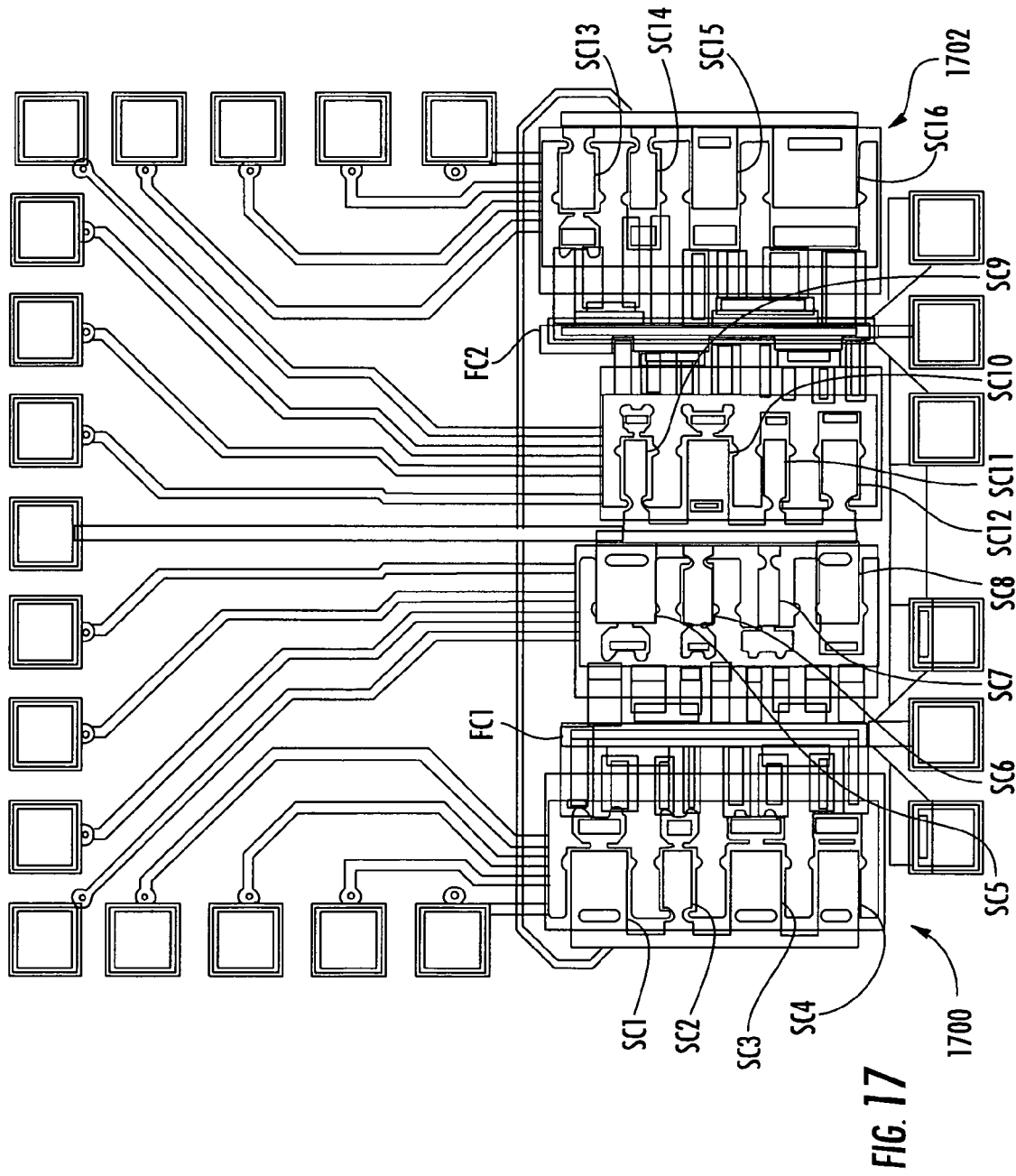
FIG. 17 is a schematic diagram of two arrays of capacitors according to the subject matter described herein.

FIG. 17 is a schematic diagram of two arrays of capacitors according to the subject matter described herein. Referring to FIG. 17, capacitor arrays 1700 and 1702 can include fixed capacitors FC1 and FC2, respectively. Further, capacitor array 1700 can include switched capacitors SC1-SC8. Capacitor array 1702 can include switched capacitors SC9-SC16. The capacitive plates of fixed capacitor FC1 and switched capacitors SC1-SC8 can be connected in parallel with one another to achieve a combined capacitive value for all of the capacitors. Likewise, the capacitive plates of fixed capacitor FC2 and switched capacitors SC9-SC16 can be connected in parallel with one another to achieve a combined capacitive value for all of the capacitors. The capacitance of each switched capacitor SC1-SC8 can be controlled for adjusting the total capacitive value of array 1700. According to one embodiment, array 1700 can be used as a variable capacitor component in a tunable duplexer (such as tunable duplexer 500 shown in FIG. 5). Although capacitor arrays 1700 and 1702 are each shown with eight switched capacitors, any suitable number and type of capacitor may be positioned in an array as described herein.

Fixed capacitor FC1 and FC2 can be any suitable fixed capacitors. For example, fixed capacitor FC1 and FC2 can be one of capacitor 800 shown in FIGS. 8A and 8B and capacitor 900 shown in FIGS. 9A and 9B. Fixed capacitor FC1 and FC2 can have any suitable capacitance value. A high capacitance value can be limited by the space required for the capacitor. A low capacitance value can be limited by parasitics of the minimum conductor area required to feed switched capacitors with low resistance.

Switched capacitors SC1-SC16 can be any suitable switched capacitor. For example, switched capacitors SC1-SC16 can be one of capacitor 1000 shown in FIGS. 10A and 10B, capacitor 1100 shown in FIG. 11, capacitor 1200 shown in FIGS. 12A and 12B, and capacitor 1300 shown in FIG. 13. Further, switched capacitors SC1-SC16 can each have different capacitance values or densities. The difference in capacitance value can be due to differences in capacitive plate size and/or the material disposed between the capacitive plates of a capacitor (e.g., air gap or dielectric).

The capacitive plates of switched capacitors SC1-SC8 can be positioned at an interior portion of array 1700. Further, fixed capacitor FC1 can be positioned at the interior portion. The actuation electrodes of switched capacitors SC1-SC8 can be positioned at an exterior portion of array 1700. By placing the capacitive components and actuation components at different portions, parasitic coupling between control signals on the actuation electrodes and RF signals on the capacitive plates can be reduced. In one embodiment, the capacitors with the largest capacitance values are positioned nearest to the RF input in order to minimize resistance. Switched capacitors SC9-SC16 and fixed capacitor FC2 of capacitor array 1702 are positioned similar to switched capacitors SC1-SC8 and fixed capacitor FC1 of capacitor array 1700 for achieving similar functions. The switchable capacitors can be positioned as close to the RF feed as possible with the largest value switchable capacitors at the closest positions to minimize losses. By keeping DC actuation around the edges of the array, DC-RF coupling can be minimized.

DC-RF isolation enables low intermodulation. The RF signal also applies forces to the electrodes. Large actuation plates can be used to lower actuation voltage. The RF signal RMS voltage may not be near the actuation voltage without causing intermodulation if the capacitor plates are actuated directly. By separating the DC actuation electrodes of the variable capacitors (such as capacitor 1000 shown in FIGS. 10A-10C), a low voltage can be achieved while operating at high RF powers with low intermodulation distortion when a variable capacitor is in an open position. In a closed position, isolation bumps or a SIP contact can be used to limit motion of the capacitor beam to reduce the potential for the RF signal to modulate the capacitance and generate intermodulation.

According to one embodiment, the switched capacitors of FIG. 17 can be adjusted to obtain a desired total capacitance value for the switched capacitors and the fixed capacitor corresponding to the switched capacitors. The control of the total capacitance value can be used to adjust for any variations in the manufacture of the capacitors such that a precise capacitance value can be achieved. The control of the total capacitance value can also compensate for variations in the manufacture of other components as well. Further, the capacitors with the highest capacitance value can be positioned near an RF input in order to maximize Q.

Figure 18:
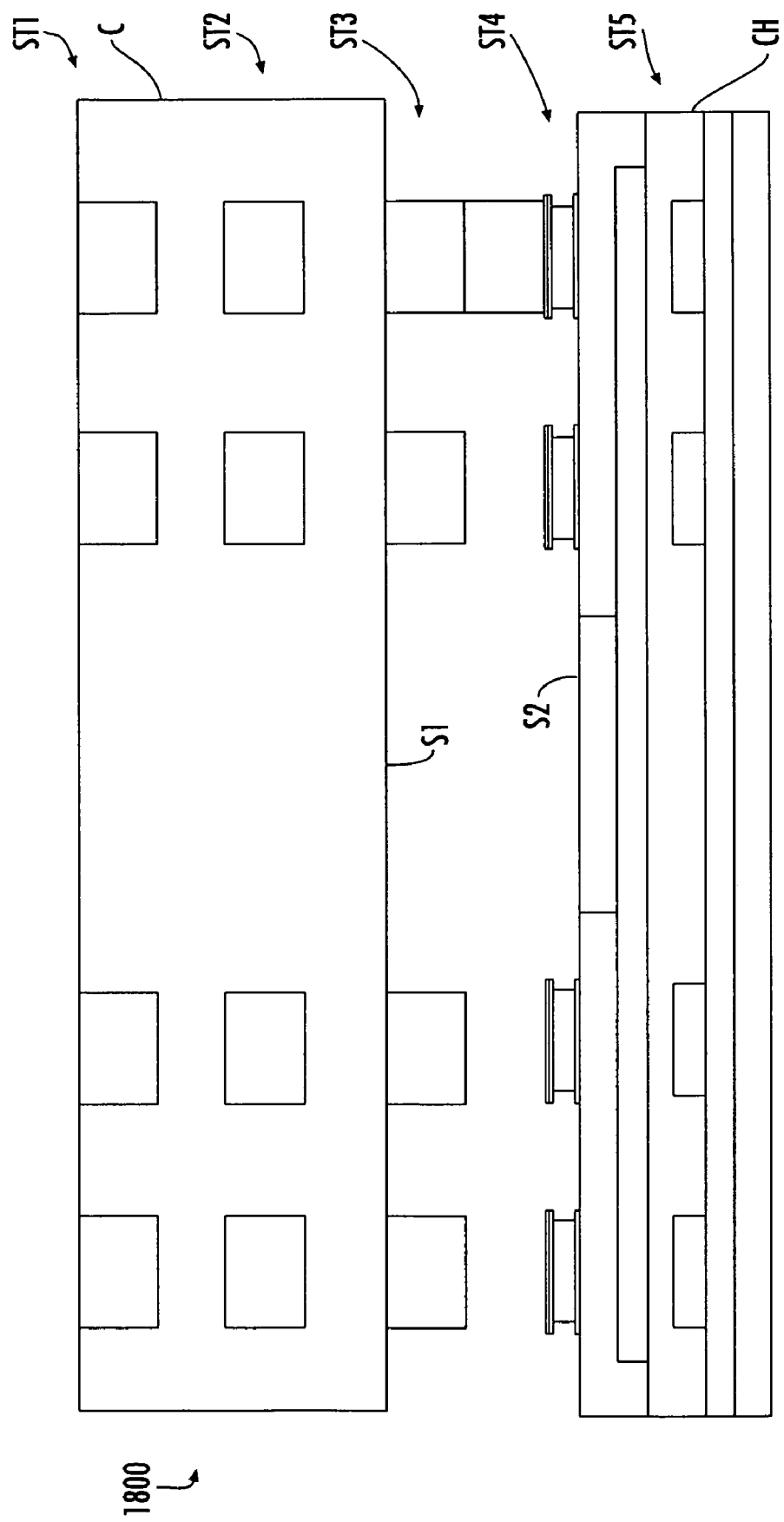
FIG. 18 is a cross-sectional side view of a high Q inductor according to one embodiment of the subject matter described herein.

FIG. 18 illustrates a cross-sectional side view of a high Q inductor 1800 according to one embodiment of the subject matter described herein. Referring to FIG. 18, inductor 1800 can include a plurality of conductive, spiral turn pairs ST1-ST5. The inner spiral turn of each spiral turn pair can be connected to one another to form a continuous spiral. Similarly, the outer spiral turn of each spiral turn pair can be connected to one another to form a continuous spiral. The inner and outer spirals can be connected at their ends. Inductor 1800 can have a high Q and low inductance value. According to one embodiment, the spirals can have a 0.5 mm diameter and an inductance of 15 mH.

According to one embodiment, spiral turn pairs ST1 and ST2 can be buried within a carrier C. Spiral turn pair ST3 can be disposed on a bottom surface S1 of carrier C. Spiral turn pair ST4 can be disposed on a top surface S2 of chip CH. Spiral turn pair ST5 can be buried within chip CH.

Figure 19:
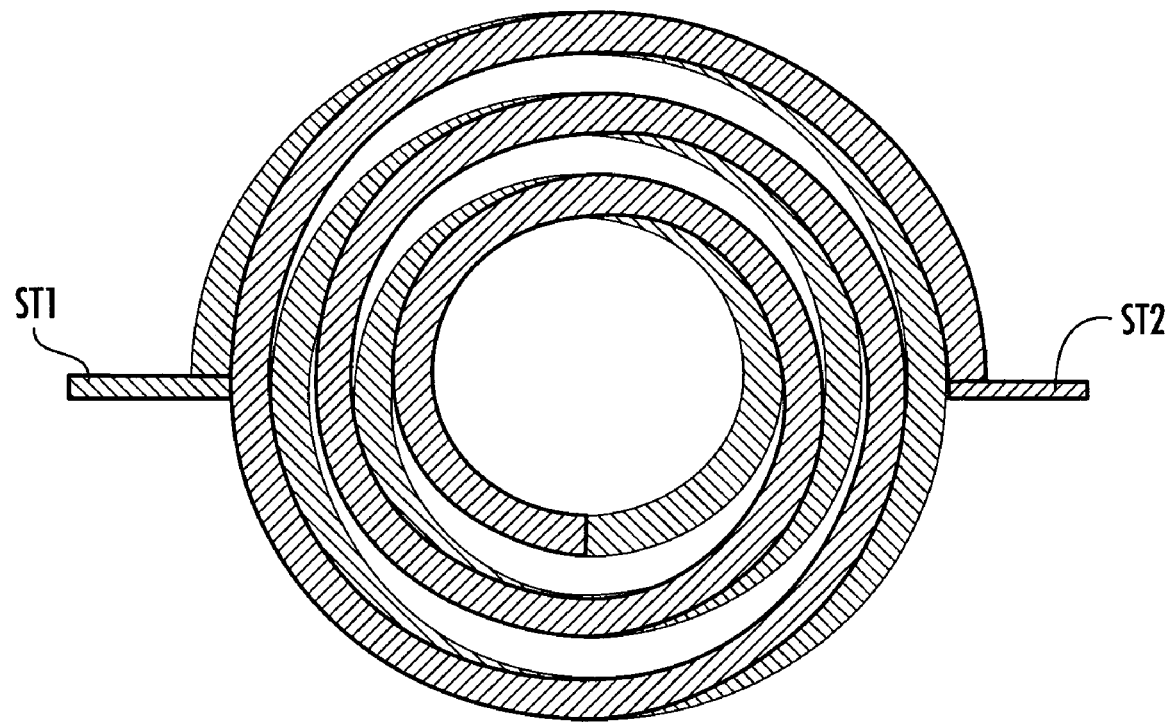
FIG. 19 is a top view of conductive, spiral turns in two layers according to one embodiment of the subject matter described herein.

FIG. 19 illustrates a top view of conductive, spiral turns ST1 and ST2 in two layers according to one embodiment of the subject matter described herein. Referring to FIG. 19, spiral turn ST1 spirals inward to contact spiral turn ST2. Spiral turn ST2 spirals outward from its contact point with spiral turn ST1. In one example, spiral turn ST1 and ST2 can include 2.75 turns per layer.

Figure 20:
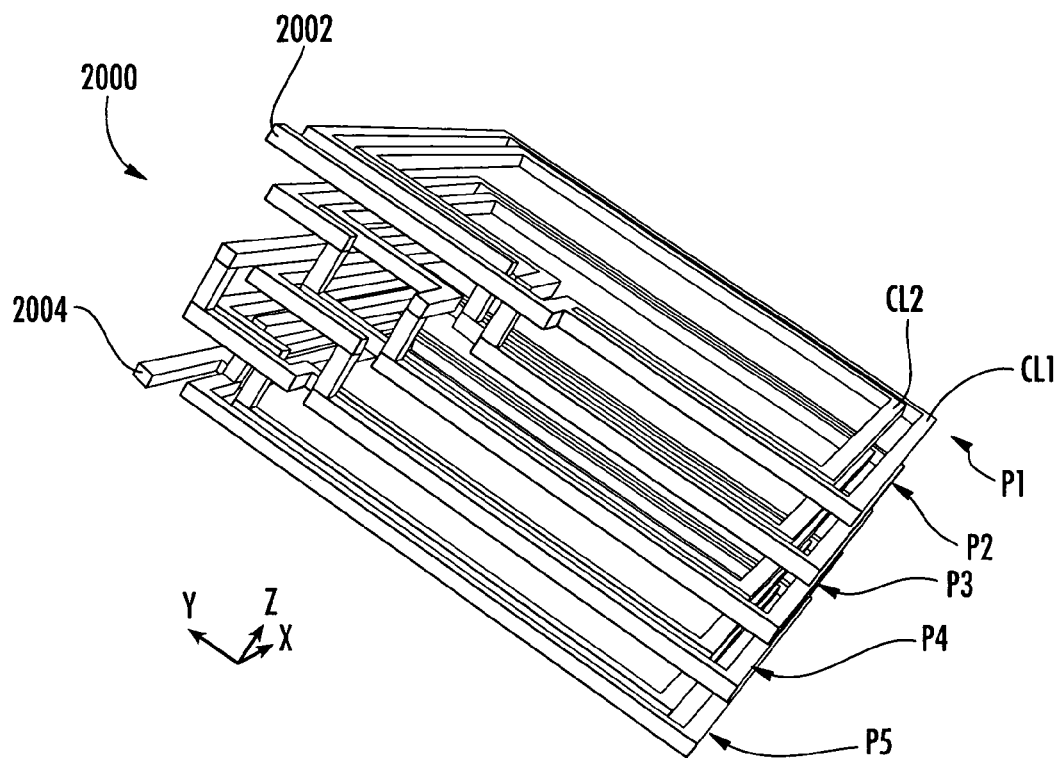
FIG. 20 is a perspective view of a MEMS inductor according to one embodiment of the subject matter described herein.

FIG. 20 illustrates a perspective view of a MEMS inductor 2000 according to one embodiment of the subject matter described herein. Referring to FIG. 20, inductor 2000 can include a plurality of conductive lines forming a wound coil to produce an inductance across ends 2002 and 2004. In this embodiment, inductor 2000 can include first and second conductive lines CP1 and CL2, which can be substantially parallel to one another along their lengths. Further, conductive lines CL1 and CL2 can connect to one another near ends 2102 and 2004. Conductive lines CL1 and CL2 can comprise five portions (generally designated P1, P2, P3, P4, and P5) that can be positioned in five different, substantially parallel planes. The conductive lines of portion P1 can be connected to one another near end 2002 and form nearly a complete loop in the plane. At the end of the loop opposing end 2002, the conductive lines of portion P1 can connect to portion P2 via two interconnects. Similar to portion P1, the conductive lines of portion P2 can form nearly a complete loop in their plane. Further, the conductive lines of portion P2 of the conductive lines connect to portion P3 via two interconnects. Similarly, the conductive lines of portion P3 can form nearly a complete loop in their plane and connect to portion P4 via two interconnects. Further, the conductive lines of portion P4 can form nearly a complete loop in their plane and connect together near end 2004.

Inductor 2000 can be fabricated using multi-layer, thin-film technology (e.g., on a semiconductor wafer or LTCC), using thick-film technology, or using a multi-layer laminated printed-circuit board technology. Alternatively, inductor 2000 can be fabricated using any other suitable fabrication technology known to those of skill in the art. Conductive lines CL1 and CL2 can be made of copper or any other suitable conductive material.

Figure 21:
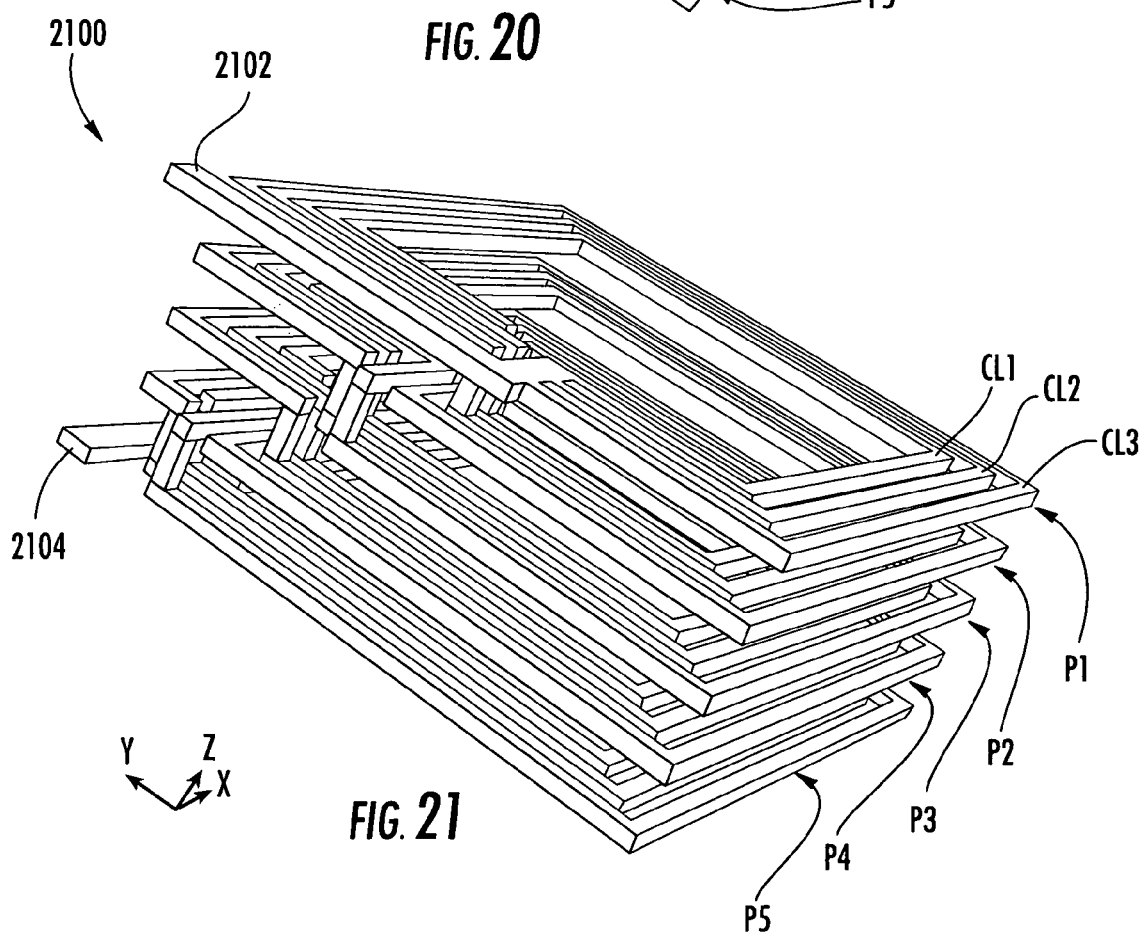
FIG. 21 is a perspective view of another MEMS inductor according to one embodiment of the subject matter described herein.

FIG. 21 illustrates a perspective view of another MEMS inductor 2100 according to one embodiment of the subject matter described herein is illustrated. Referring to FIG. 21, inductor 2100 can include a plurality of conductive lines forming a wound coil to produce an inductance across ends 2102 and 2104. In this embodiment, inductor 2100 can include first, second, and third conductive lines CL1, CL2, and CL3, which can be substantially parallel to one another along their lengths. Further, conductive lines CL1, CL2, and CL3 can connect to one another near ends 2102 and 2104. Conductive lines CL1, CL2, and CL3 can comprise five portions (generally designated P1, P2, P3, P4, and P5) that can be positioned in five different, substantially parallel planes. The conductive lines of portion P1 can be connected to one another near end 2102 and can form nearly a complete loop in the plane. At the end of the loop opposing end 2102, the conductive lines of portion P1 can connect to portion P2 via three interconnects. Similar to portion P1, the conductive lines of portion P2 can form nearly a complete loop in their plane. Further, the conductive lines of portion P2 can connect to portion P3 via three interconnects. Similarly, the conductive lines of portion P3 can form nearly a complete loop in their plane and connect to portion P4 via three interconnects. Further, the conductive lines of portion P4 can form nearly a complete loop in their plane and connect together near end 2104.

Figure 22:
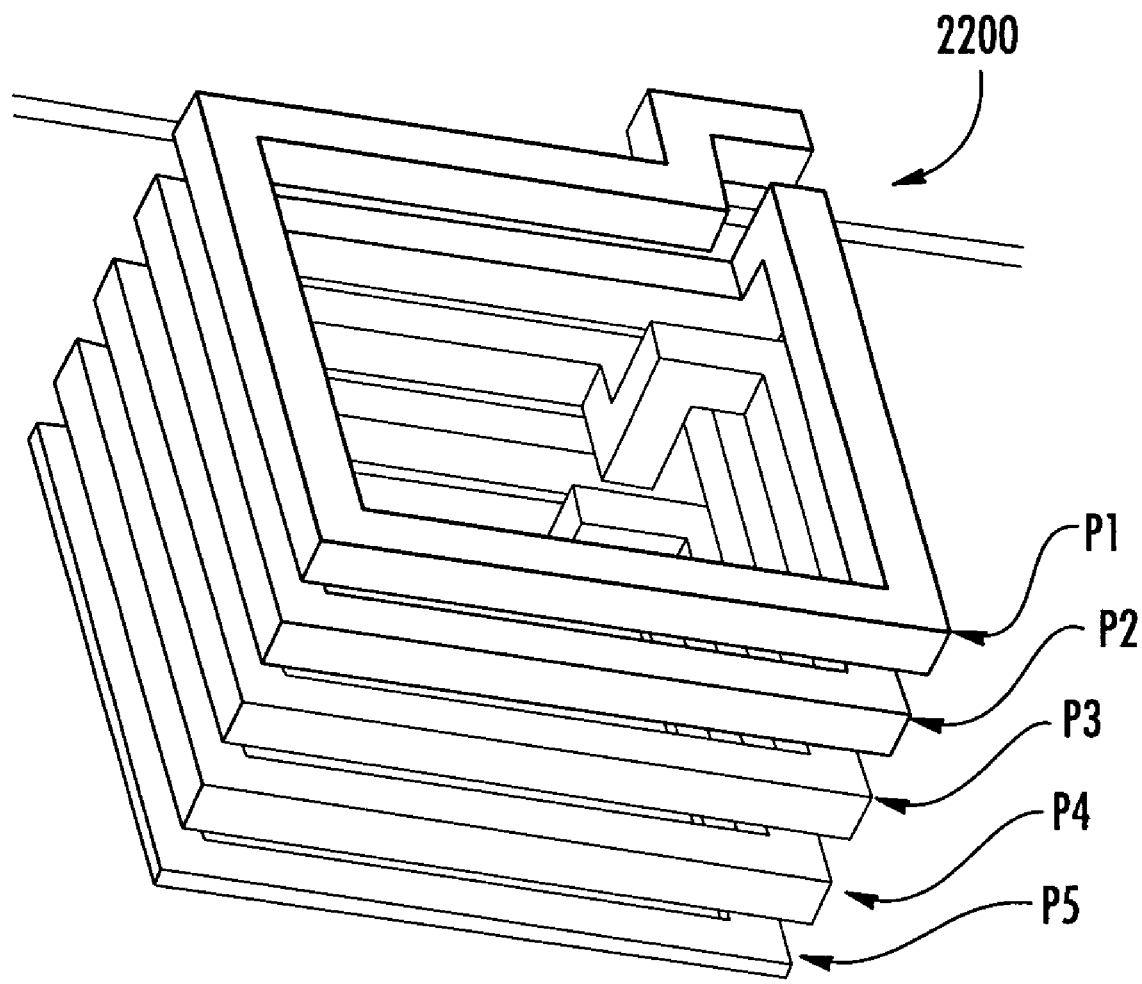
FIG. 22 is a perspective view of another MEMS inductor according to one embodiment of the subject matter described herein.

FIG. 22 illustrates a perspective view of another MEMS inductor 2200 according to one embodiment of the subject matter described herein is illustrated. Referring to FIG. 22, inductor 2200 can include a single conductive line CL forming a wound coil to produce an inductance across its ends. In this embodiment, conductive lines CL can comprise five portions (generally designated P1, P2, P3, P4, and P5) that can be positioned in five different, substantially parallel planes. Portion P1 of conductive line CL can form nearly a complete loop in its plane. At one end of portion P1, conductive line CL can connect to portion P2 via an interconnect. Similar to portion P1, portion P2 of conductive line CL can form nearly a complete loop in its plane. Further, portion P2 of conductive line CL can connect to portion P3 via an interconnect. Similarly, portion P3 of conductive line CL can form nearly a complete loop in its plane and can connect to portion P4 via an interconnect. Further, portion P4 of conductive line CL can form nearly a complete loop in its plane.

Figure 23:
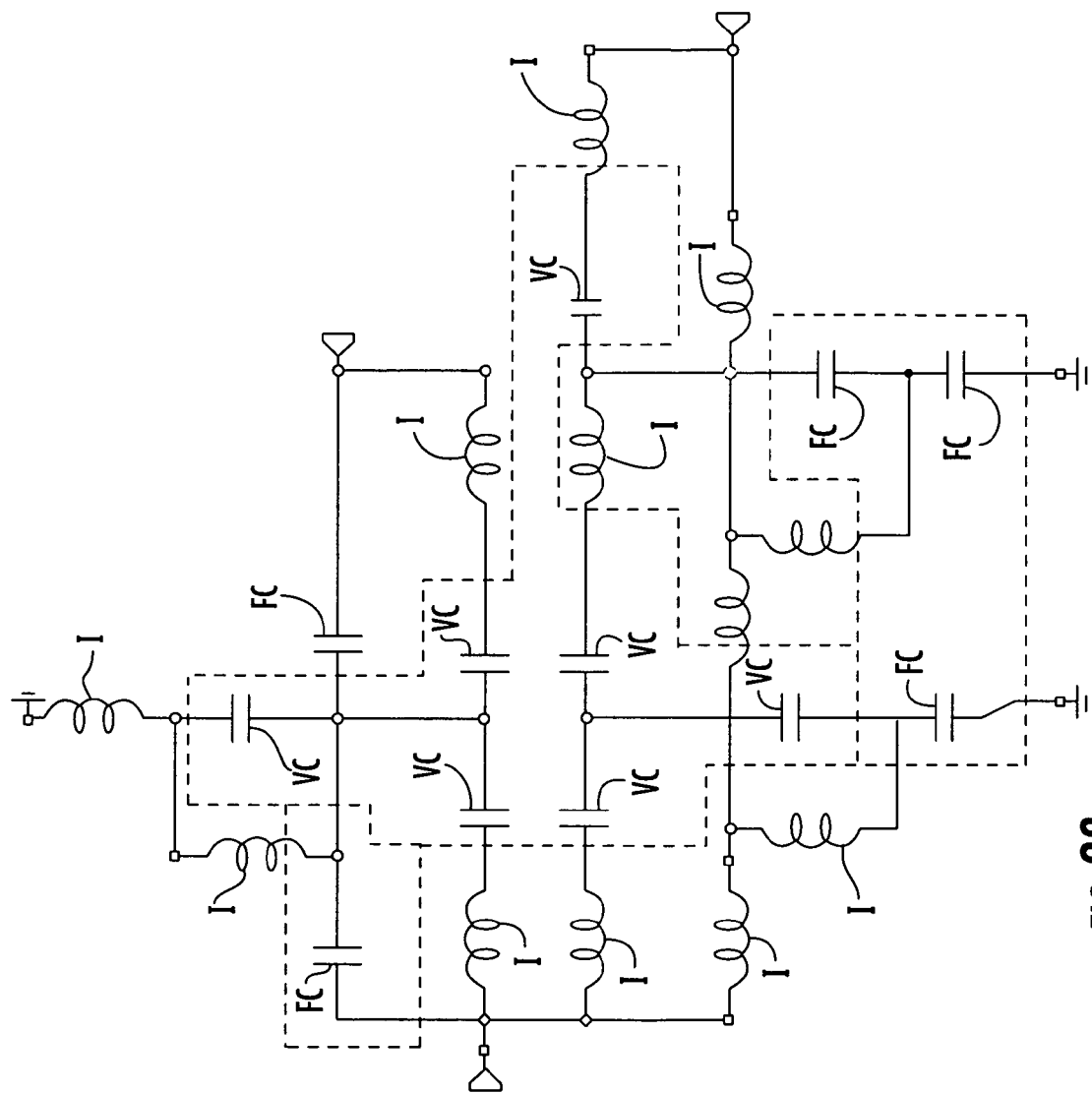
FIG. 23 is a schematic diagram of a circuit floor plan of a tunable duplexer according to one embodiment of the subject matter described herein is illustrated.

According to one aspect, duplexer components can be arranged on one or more chips in order to minimize space requirements. FIG. 23 illustrates a schematic diagram of different circuit floor plans of tunable duplexer 600 shown in FIG. 6. Referring to FIG. 23, in one circuit floor plan, all of inductors I and capacitors (fixed capacitors FC and variable capacitors VC) can be maintained on-chip. In another floor plan, all of the capacitors FC and VC can be on the chip, and inductors I can be arrayed in the package around the capacitor die. In yet another floor plan, all of the variable capacitors VC can be on the chip, and fixed capacitors FC and inductors I are arrayed in the package around the capacitor die.

Figure 24:
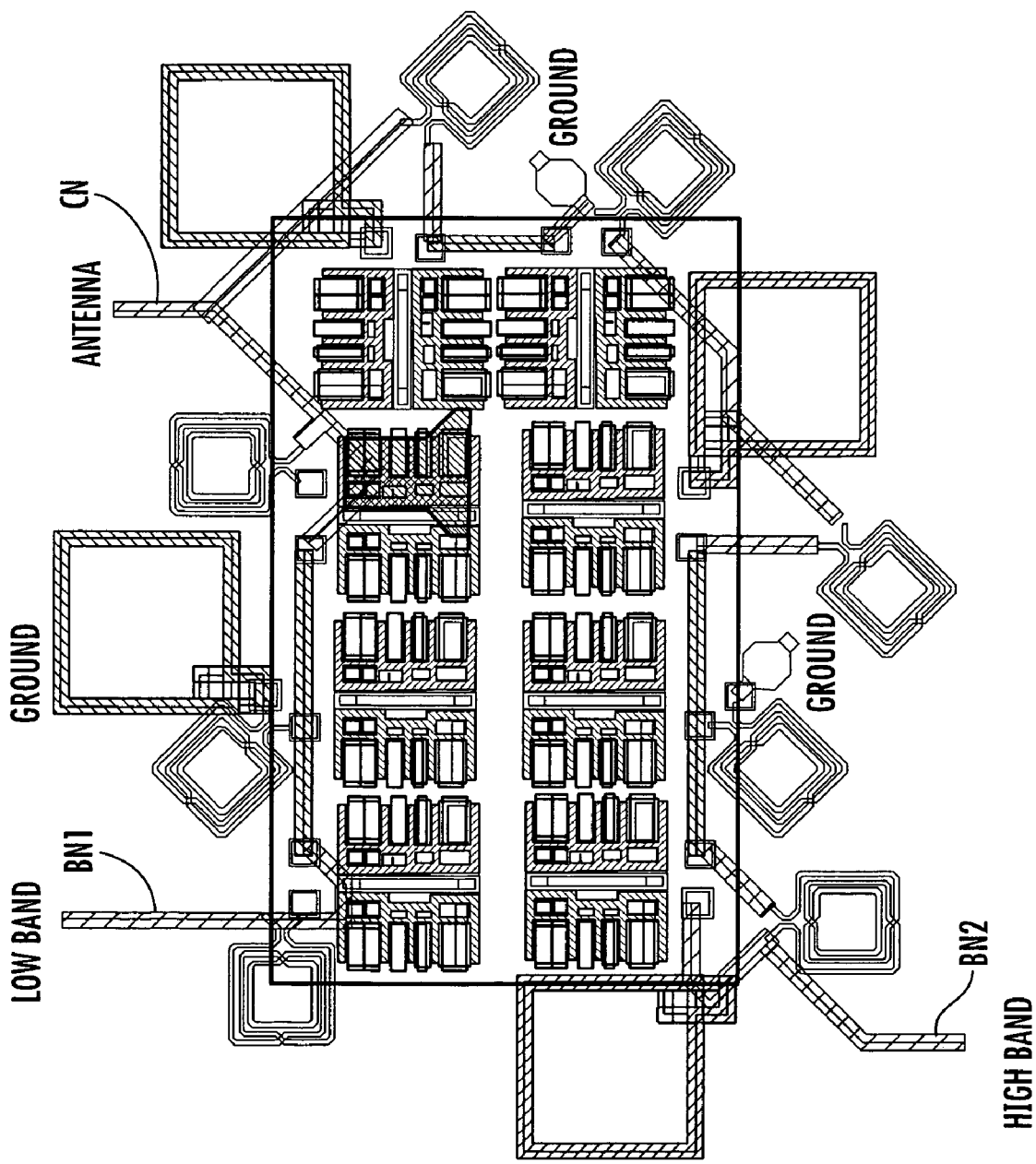
FIG. 24 is a circuit diagram of tunable duplexer of FIG. 6 according to one embodiment of the subject matter described herein.

FIG. 24 illustrates a circuit diagram of tunable duplexer 600 of FIG. 6 according to one embodiment of the subject matter described herein. Referring to FIG. 24, an antenna can be connected to common node CN. Further, transmission circuitry can be connected to band node BN1. Reception circuitry can be connected to band node BN2. A plurality of capacitors can be positioned within an interior of the circuit. Further, inductors can be positioned around the edges of the circuit.

Figure 25:
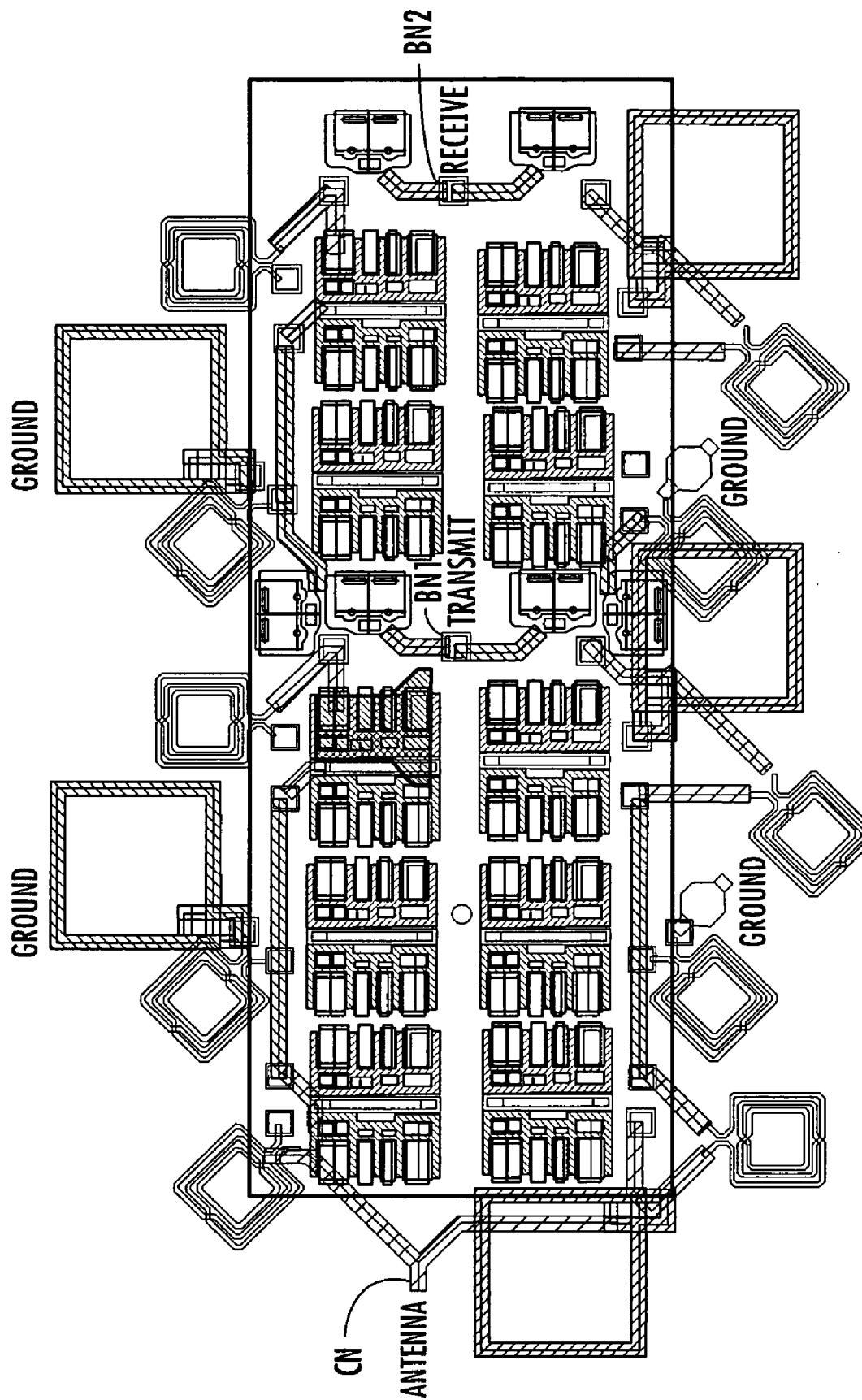
FIG. 25 is a circuit diagram of a tunable duplexer of FIG. 7 according to one embodiment of the subject matter described herein.

FIG. 25 illustrates a circuit diagram of tunable duplexer 700 of FIG. 7 according to one embodiment of the subject matter described herein. Referring to FIG. 25, an antenna can be connected to common node CN. Further, transmission circuitry can be connected to band node BN1. Reception circuitry can be connected to band node BN2. A plurality of capacitors can be positioned within an interior of the circuit. Further, inductors can be positioned around the edges of the circuit.

Figure 26:
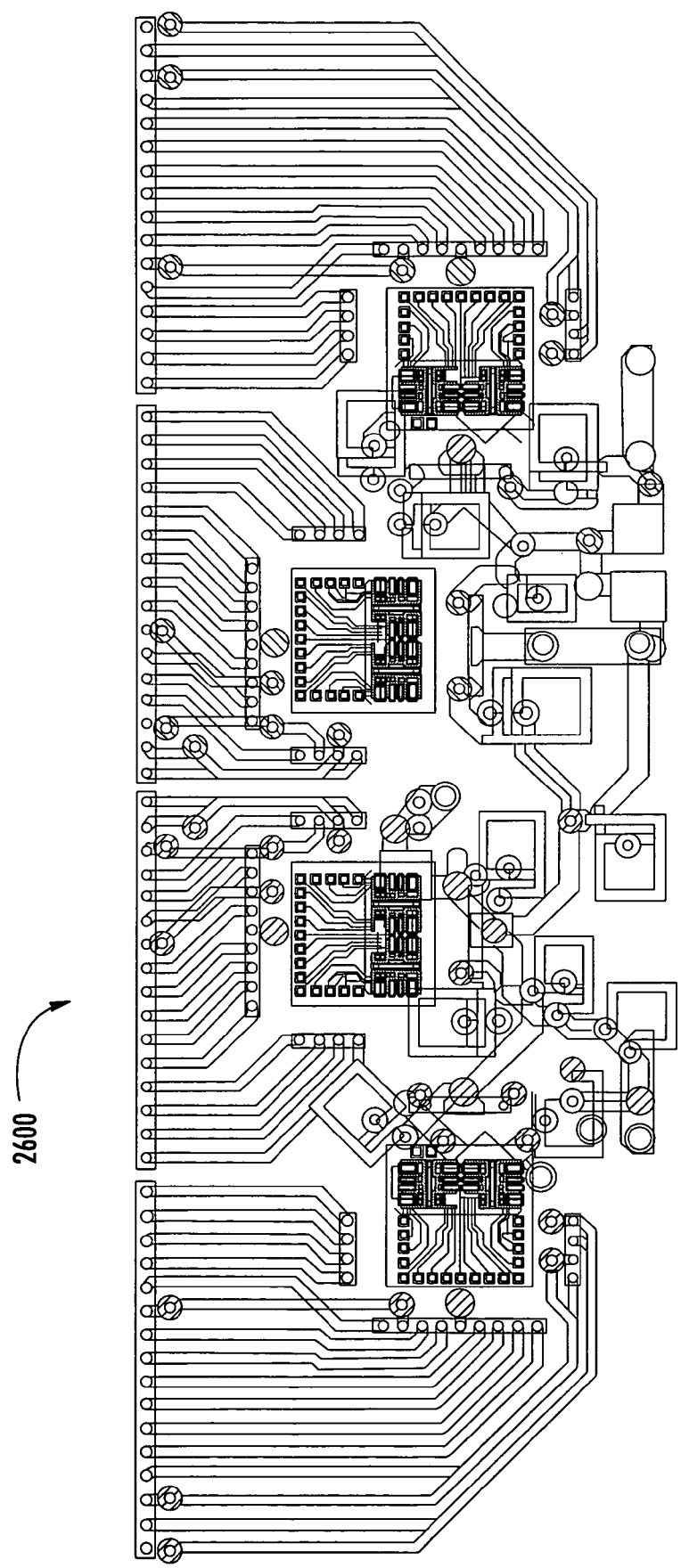
FIG. 26 is a circuit diagram of another tunable duplexer according to one embodiment of the subject matter described herein.

FIG. 26 illustrates a circuit diagram of a tunable duplexer 2600 according to one embodiment of the subject matter described herein. Referring to FIG. 26, duplexer 2600 can include a plurality of capacitor array set (such as the capacitor arrays shown in FIG. 17) and inductors (such as the inductors shown in FIG. 18-22). The capacitor arrays can be positioned in a separate position than the inductors as shown.

Experimentation Results

Figure 27:
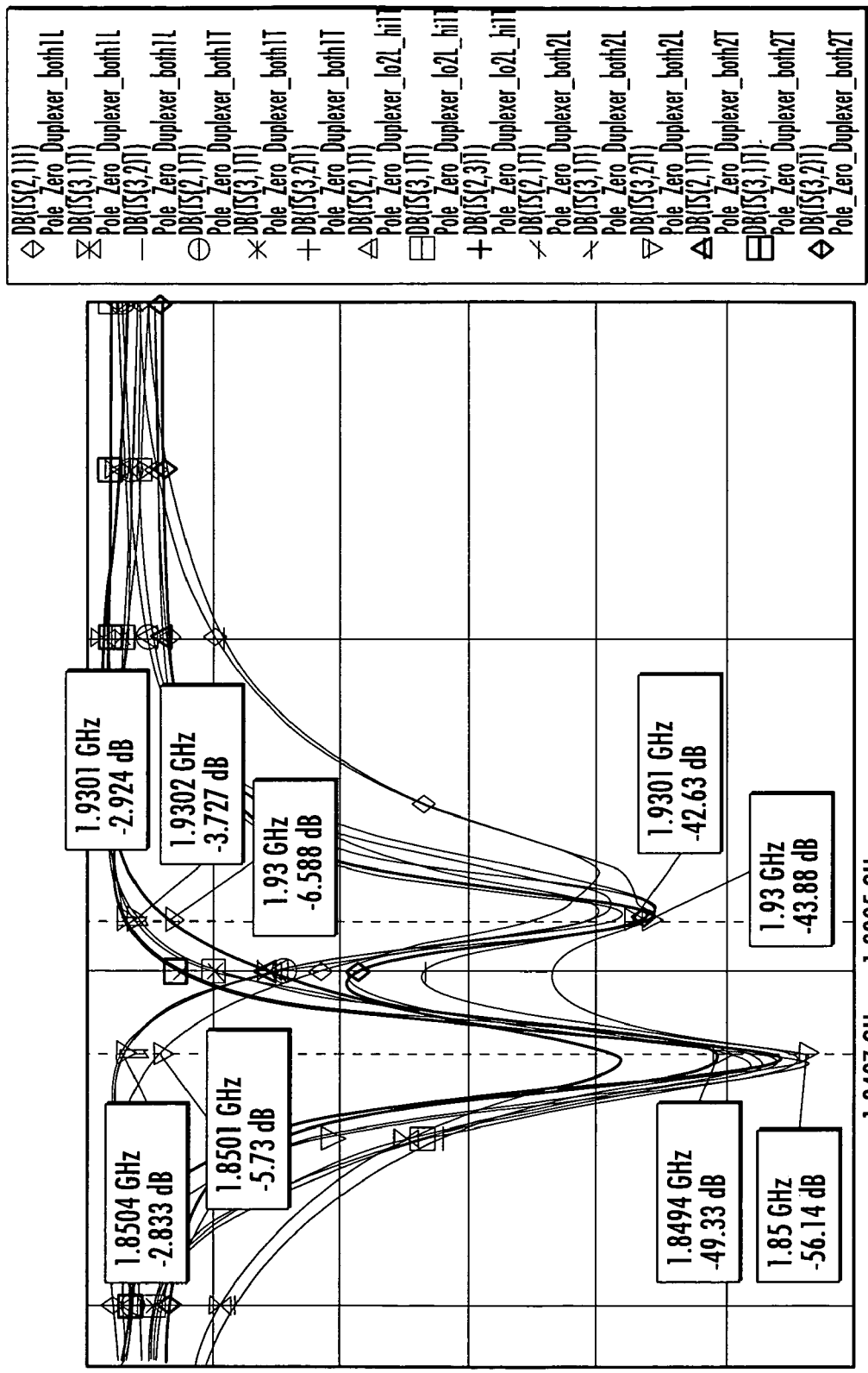
FIG. 27 is a graph of computer simulation results of different duplexers having a different number of pole-zero elements according to the subject matter described herein.

FIGS. 27-32 are graphs of computer simulation results of different duplexers having a different number of pole-zero elements according to the subject matter described herein. Referring to FIG. 27, the results shown in the graph demonstrate that by providing additional pole-zero elements, frequency cutoffs are sharper and isolation higher at the expense of higher losses. Referring to FIG. 27, each plot on the graph represents results for a different duplexer. The graph includes a table identifying the plots. The duplexer corresponding to the plots identified "both1L" has one series and one shunt pole-zero element on both high and low bands. The duplexer corresponding to the plots identified "both1T" has two series and one shunt pole-zero element on both high and low bands. The duplexer corresponding to the plots identified "lo2L_hi1T" has two series and two shunt pole-zero elements on the low band side and one shunt pole-zero element on the high band side. The results in the graph demonstrates that there are different insertion losses for different numbers of pole-zero elements. Further, the results in the graph demonstrates that different isolations are achieved for different numbers of pole-zero elements.

Figure 28:
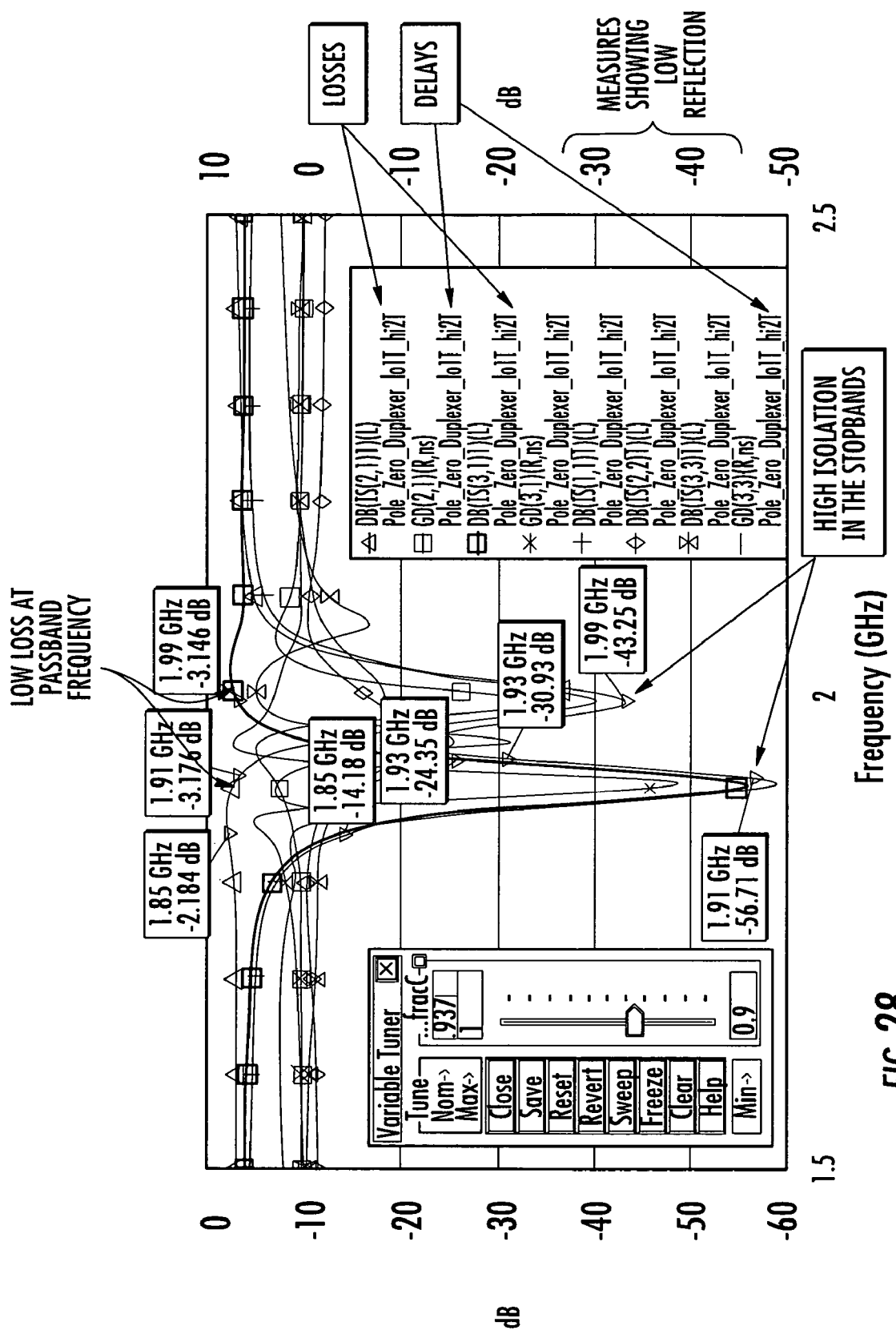
FIG. 28 is a graph of personal communication service (PCS) simulations of the duplexer shown in FIG. 6.
Figure 29:
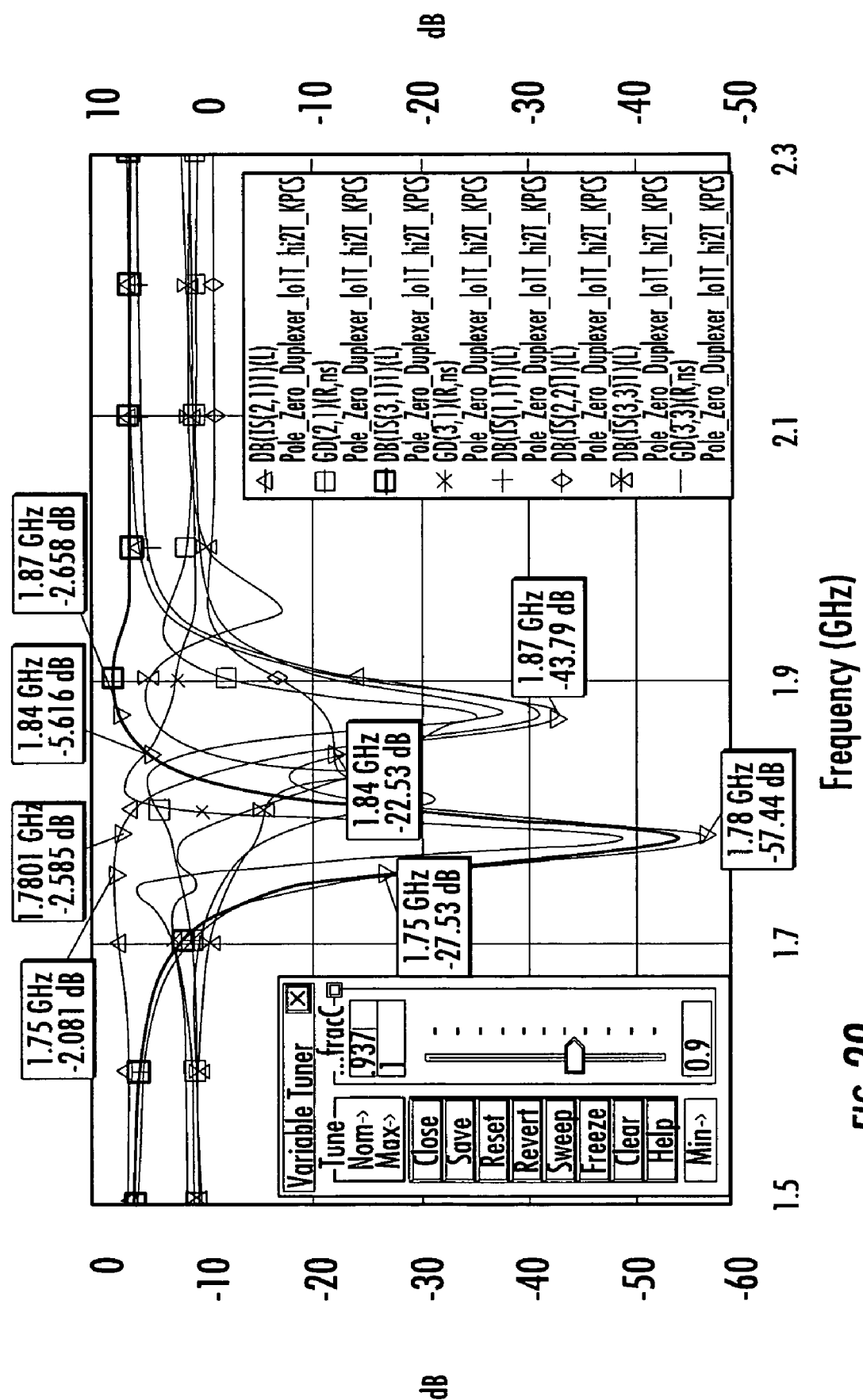
FIG. 29 is a graph of Korean PCS (KPCS) simulations of a duplexer shown in FIG. 6.
Figure 30:
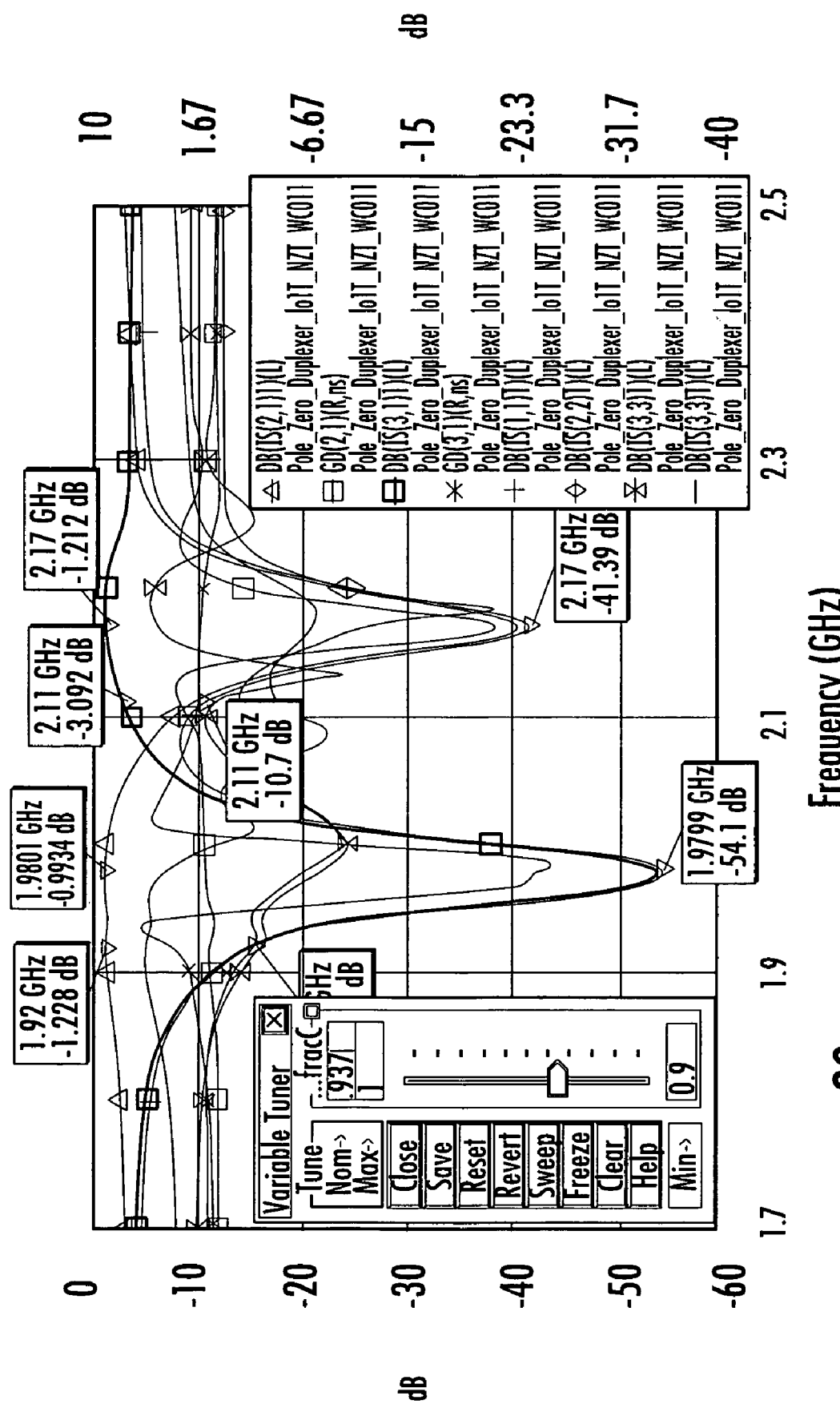
FIG. 30 is a graph of International Mobile Telecommunications 2000 (IMT2000) simulations of the duplexer shown in FIG. 6.
Figure 31:
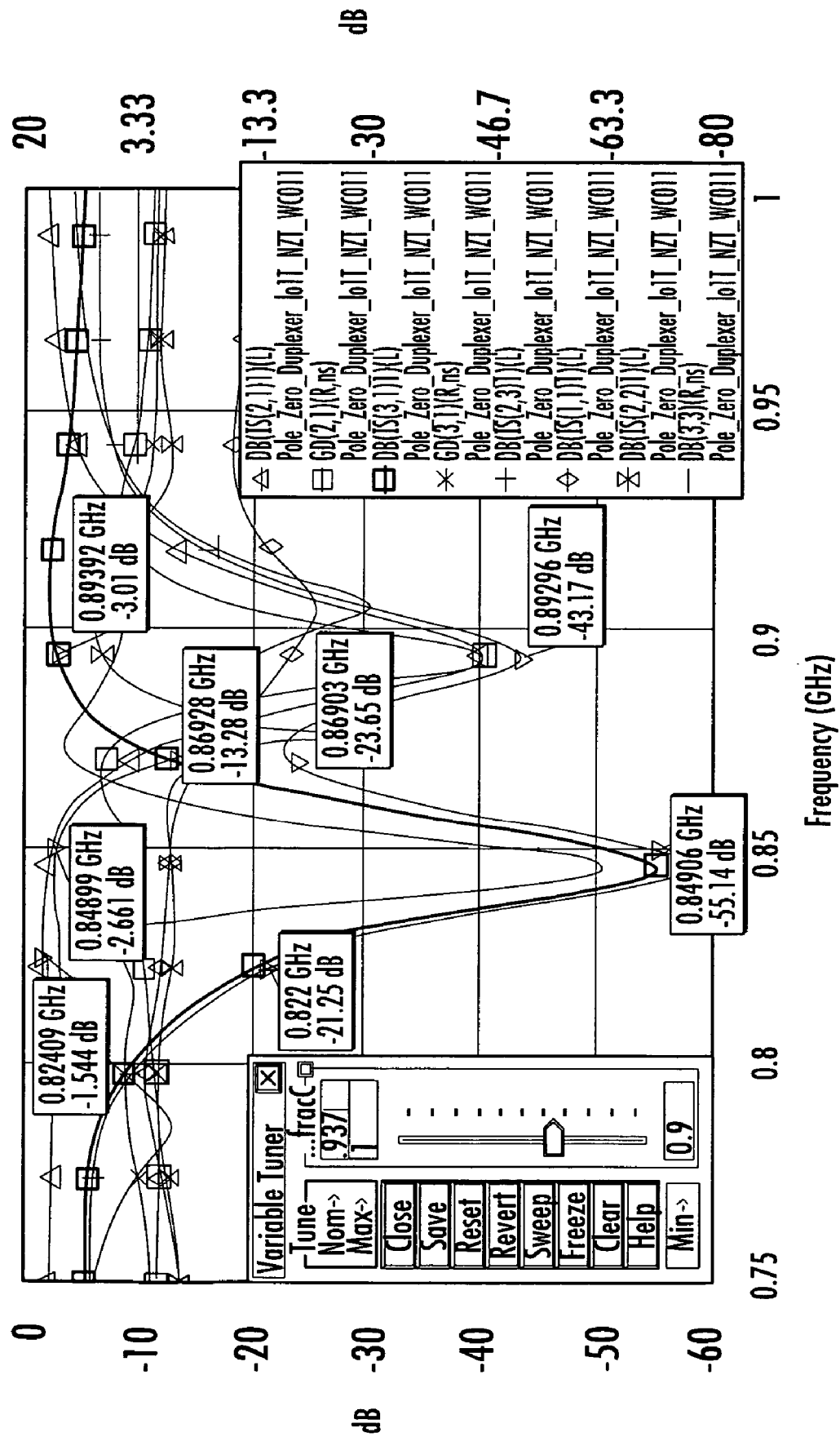
FIG. 31 is a graph of the cellular and tuning results of the duplexer shown in FIG. 6.
Figure 32:
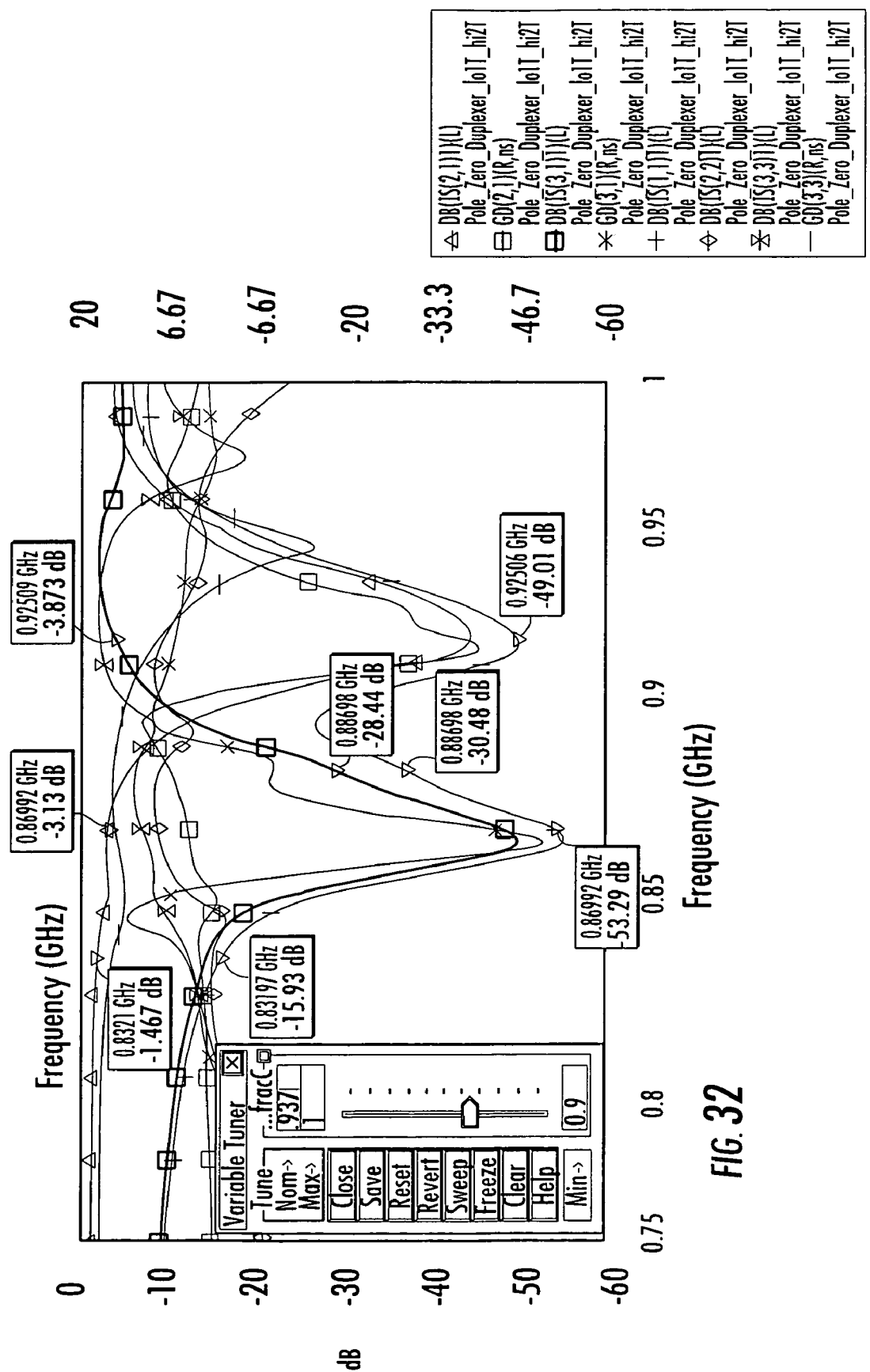
FIG. 32 is a graph of Japanese CDMA simulations of the duplexer shown in FIG. 6.

FIGS. 28-32 demonstrate other characteristics of duplexers according to the subject matter described herein. FIG. 28 is a graph of personal communication service (PCS) simulations of duplexer 600 shown in FIG. 6. FIG. 29 is a graph of Korean PCS (KPCS) simulations of duplexer 600 shown in FIG. 6. FIG. 30 is a graph of International Mobile Telecommunications 2000 (IMT2000) simulations of duplexer 600 shown in FIG. 6. FIG. 31 is a graph of the cellular and tuning results of duplexer 600 shown in FIG. 6. FIG. 32 is a graph of Japanese CDMA simulations of duplexer 600 shown in FIG. 6.

Figure 33:
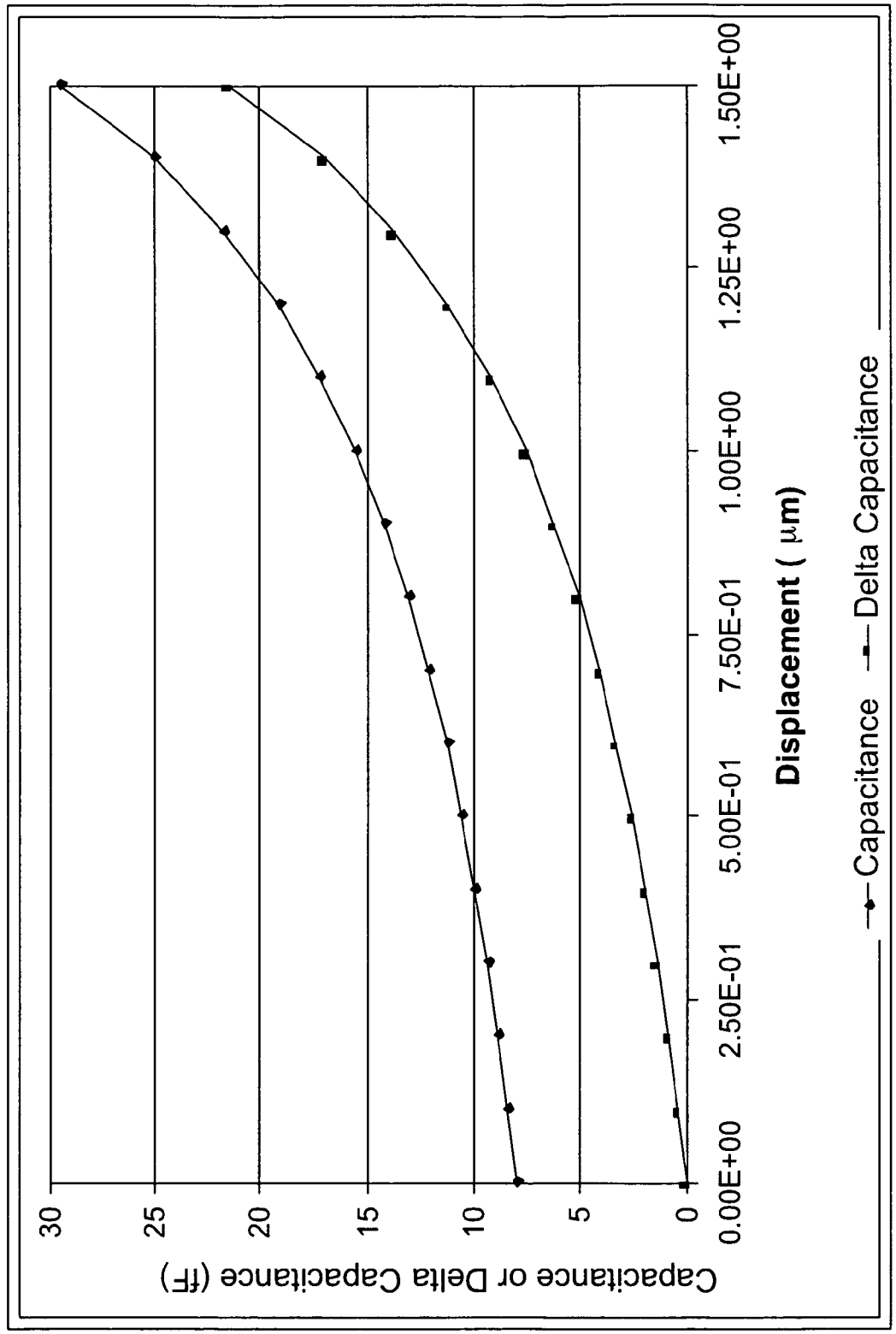
FIG. 33 is a graph of computer simulation results of the capacitor shown in FIGS. 10A-10C.
Figure 34:
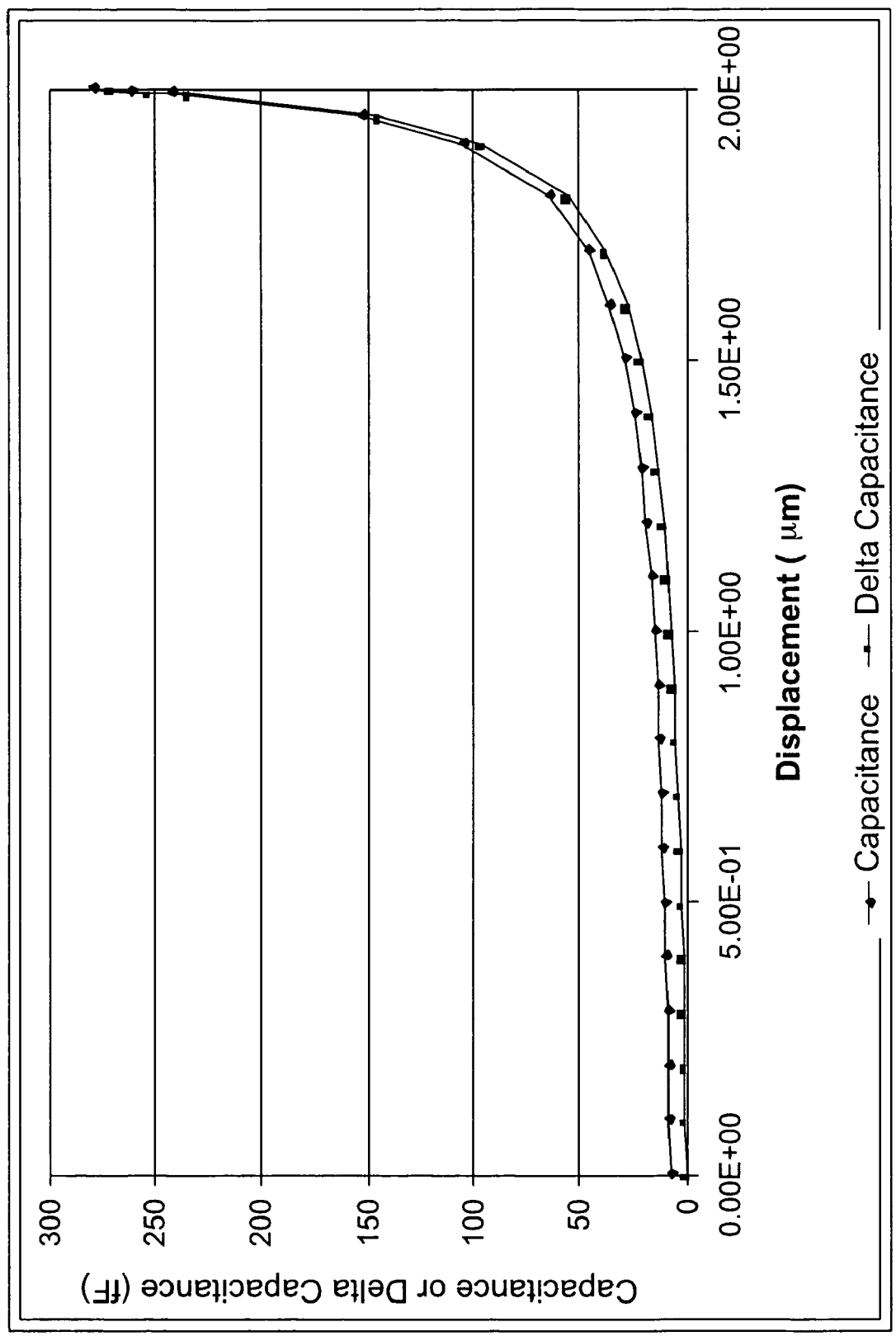
FIG. 34 is a graph of computer simulation results of the capacitor shown in FIGS. 11A and 11B.

FIGS. 33 and 34 are graphs of computer simulation results of different variable capacitors according to the subject matter described herein. Referring to FIG. 33, the graph illustrates the displacement versus capacitance for capacitor 1000 shown in FIGS. 10A-10C. The graph illustrates exemplary capacitance change of capacitor 1000 over different displacement differences between the capacitive plates.

Referring to FIG. 34, the graph illustrates the displacement versus capacitance for capacitor 1100 shown in FIGS. 11A and 11B. The graph illustrates exemplary capacitance change of capacitor 1100 over different displacement differences between the capacitive plates.

It will be understood that various details of the subject matter disclosed herein may be changed without departing from the scope of the subject matter. Furthermore, the foregoing description is for the purpose of illustration only, and not for the purpose of limitation.

What is claimed is:

1. A tunable duplexer comprising:
   (a) a common node for communicating signals comprising a plurality of frequencies;
   (b) first and second band nodes for communicating first and second predetermined frequency bands, respectively, of the plurality of frequencies; and
   (c) a filter coupled between the common node and the first and second band nodes, wherein the filter comprises pole-zero elements adapted to pass signals of the first and second predetermined frequency bands to the first and second band nodes, respectively, and adapted to block signals of the first and second predetermined frequency bands to the second and first band nodes, respectively, wherein one of the pole-zero elements comprises at least one capacitor and inductor connected in parallel.

2. The tunable duplexer of claim 1 wherein the capacitor is a variable capacitor.

3. The tunable duplexer of claim 1 wherein the capacitor is a switchable multi-state capacitor.

4. A tunable duplexer comprising:
(a) a common node for communicating signals comprising a plurality of frequencies;
(b) first and second band nodes for communicating first and second predetermined frequency bands, respectively, of the plurality of frequencies; and
(c) a filter coupled between the common node and the first and second band nodes, wherein the filter comprises pole-zero elements adapted to pass signals of the first and second predetermined frequency bands to the first and second band nodes, respectively, and adapted to block signals of the first and second predetermined frequency bands to the second and first band nodes, respectively,
wherein one of the pole-zero elements comprises:
a first capacitor connected in series with the common node and one of the first and second band nodes; and
an inductor and a second capacitor connected in a series arrangement, wherein the series arrangement is connected in parallel with the first capacitor.

5. The tunable duplexer of claim 4 wherein one of the first and second capacitors is a MEMS capacitor.

6. The tunable duplexer of claim 5 wherein the MEMS capacitor is a variable capacitor comprising a variable capacitance being controllable for tuning the filtering characteristics of the filter.

7. A tunable duplexer comprising:
(a) a common node for communicating signals comprising a plurality of frequencies;
(b) first and second band nodes for communicating first and second predetermined frequency bands, respectively, of the plurality of frequencies; and
(c) a filter coupled between the common node and the first and second band nodes, wherein the filter comprises pole-zero elements adapted to pass signals of the first and second predetermined frequency bands to the first and second band nodes, respectively, and adapted to block signals of the first and second predetermined frequency bands to the second and first band nodes, respectively,
wherein one of the pole-zero elements comprises:
a first inductor connected in series with the common node and one of the first and second band nodes; and
a capacitor and a second inductor connected in a series arrangement, wherein the series arrangement is connected in parallel with the first inductor.

8. The tunable duplexer of claim 7 wherein the capacitor is a MEMS capacitor.

9. The tunable duplexer of claim 8 wherein the MEMS capacitor is a variable capacitor comprising a variable capacitance being controllable for tuning the filtering characteristics of the filter.

10. A tunable duplexer comprising:
(a) a common node for communicating signals comprising a plurality of frequencies;
(b) first and second band nodes for communicating first and second predetermined frequency bands, respectively, of the plurality of frequencies; and
(c) a filter coupled between the common node and the first and second band nodes, wherein the filter comprises pole-zero elements adapted to pass siqnals of the first and second predetermined frequency bands to the first and second band nodes, respectively, and adapted to block siqnals of the first and second predetermined frequency bands to the second and first band nodes, respectively,
wherein one of the pole-zero elements comprises:
first and second capacitors connected in a series arrangement comprising first and second ends, wherein one of the first and second ends is connected between the common node and one of the first and second band nodes; and
an inductor connected in parallel with one of the first and second capacitors.

11. The tunable duplexer of claim 10 wherein one of the first and second capacitors is a MEMS capacitor.

12. The tunable duplexer of claim 11 wherein the MEMS capacitor is a variable capacitor comprising a variable capacitance being controllable for tuning the filtering characteristics of the filter.

13. A tunable duplexer comprising:
(a) a common node for communicatinq signals comprising a plurality of Frequencies;
(b) first and second band nodes for communicating first and second predetermined frequency bands, respectively, of the plurality of frequencies; and
(c) a filter coupled between the common node and the first and second band nodes, wherein the filter comprises pole-zero elements adapted to pass signals of the first and second predetermined frequency bands to the first and second band nodes, respectively, and adapted to block signals of the first and second predetermined frequency bands to the second and first band nodes, respectively,
wherein one of the pole-zero elements comprises:
first and second inductors connected in a series arrangement comprising first and second ends, wherein one of the first and second ends is connected between the common node and one of the first and second band nodes; and
a capacitor connected in parallel with one of the first and second inductors.

14. The tunable duplexer of claim 13 wherein the capacitor is a MEMS capacitor.

15. The tunable duplexer of claim 14 wherein the MEMS capacitor is a variable capacitor comprising a variable capacitance being controllable for tuning the filtering characteristics of the filter.

16. A tunable duplexer comprising:
(a) first, second, and third nodes for communicating transmission signals;
(b) a first variable filter coupled between the first and second nodes and comprising a first plurality of pole-zero elements having a first predetermined pole-zero response to the transmission signals; and
(c) a second variable filter coupled between the first node and a third node and comprising a second plurality of pole-zero elements for generating an output signal having a second predetermined pole-zero response to the transmission signals,
wherein one of the pole-zero elements comprises at least one capacitor and inductor connected in parallel.

17. The tunable duplexer of claim 16 wherein the capacitor is a variable capacitor.

18. The tunable duplexer of claim 16 wherein the capacitor is a switchable multi-state capacitor.

* * * * *